US012597758B2

(12) United States Patent
Chen et al.

(10) Patent No.: US 12,597,758 B2
(45) Date of Patent: Apr. 7, 2026

(54) TWO-SEGMENT DBR LASER AND MONOLITHICALLY INTEGRATED ARRAY LIGHT SOURCE CHIP

(71) Applicant: Huawei Technologies Co., Ltd., Shenzhen (CN)

(72) Inventors: Hongmin Chen, Wuhan (CN); Can Zhang, Wuhan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 1010 days.

(21) Appl. No.: 17/334,000

(22) Filed: May 28, 2021

(65) Prior Publication Data

US 2021/0288469 A1     Sep. 16, 2021

Related U.S. Application Data

(63) Continuation of application No. PCT/CN2018/118147, filed on Nov. 29, 2018.

(51) Int. Cl.
 *H01S 5/125* (2006.01)
 *H01S 5/06* (2006.01)
 (Continued)

(52) U.S. Cl.
 CPC ............ *H01S 5/125* (2013.01); *H01S 5/0612* (2013.01); *H01S 5/1025* (2013.01); *H01S 5/22* (2013.01); *H01S 5/4025* (2013.01)

(58) Field of Classification Search
 CPC .... H01S 5/125; H01S 5/06256; H01S 5/0612; H01S 5/22–2228; H01S 5/40–4093
 See application file for complete search history.

(56) References Cited

U.S. PATENT DOCUMENTS 5,325,392 A * 6/1994 Tohmori ................ G02B 6/124
                                                            372/46.01
5,452,318 A   9/1995 Makino et al.
(Continued)

FOREIGN PATENT DOCUMENTS

CN   103532009 A   1/2014
CN   103545715 A   1/2014
(Continued)

OTHER PUBLICATIONS

Kanazawa, S. et al. "A Compact EADFB Laser Array Module for a Future 100-GB/s Ethernet Transceiver", IEEE Journal of Selected Topics in Quantum Electronics, vol. 17, No. 5, Sep./Oct. 2011, 7 pages.

*Primary Examiner* — Tod T Van Roy
*Assistant Examiner* — Fernanda Adriana Camacho Alanis
(74) *Attorney, Agent, or Firm* — Slater Matsil, LLP

(57) ABSTRACT

This application provides a two-segment DBR laser and a monolithically integrated array light source chip, and relates to the field of optical communications. The two-segment DBR laser includes a grating region, a gain region, and a broadband reflector. The grating region and the broadband reflector are respectively disposed at two ends of the gain region. The grating region includes a first bottom liner, a first support structure, a first ridge waveguide structure, and a first heater. The first ridge waveguide structure is fastened by the first support structure and suspended in midair above the first bottom liner, and the first bottom liner, the first support structure, and the first ridge waveguide structure jointly form a cavity. The first heater is located on a surface that is of the first ridge waveguide structure and that faces away from the cavity.

20 Claims, 21 Drawing Sheets

(51) Int. Cl.
    *H01S 5/10*           (2021.01)
    *H01S 5/22*           (2006.01)
    *H01S 5/40*           (2006.01)

(56) References Cited

U.S. PATENT DOCUMENTS

| | | | |
|---|---|---|---|
| 5,732,102 A | 3/1998 | Bouadma | |
| 6,807,215 B2 | 10/2004 | Lam et al. | |
| 8,861,556 B2* | 10/2014 | Larson | H01S 5/02461 |
| | | | 372/98 |
| 9,509,119 B2 | 11/2016 | Chen | |
| 2003/0169786 A1* | 9/2003 | Kapon | H01S 5/18341 |
| | | | 438/22 |
| 2004/0218850 A1* | 11/2004 | Peters | H01S 5/2231 |
| | | | 372/50.1 |
| 2005/0244994 A1* | 11/2005 | Meliga | B82Y 20/00 |
| | | | 438/22 |

| | | | |
|---|---|---|---|
| 2009/0074020 A1 | 3/2009 | Matsui et al. | |
| 2009/0269069 A1 | 10/2009 | Mahgerefteh et al. | |
| 2010/0311195 A1* | 12/2010 | Matsui | B82Y 20/00 |
| | | | 438/31 |
| 2017/0133824 A1* | 5/2017 | Liang | H01S 5/0078 |
| 2017/0194764 A1* | 7/2017 | Evans | G02F 1/2255 |
| 2018/0205199 A1 | 7/2018 | Kwon et al. | |
| 2018/0212400 A1* | 7/2018 | Kaneko | H01S 5/06258 |
| 2018/0269659 A1* | 9/2018 | Ishii | H01S 5/0206 |
| 2019/0386463 A1* | 12/2019 | Morrison | H01S 5/06255 |
| 2020/0076155 A1 | 3/2020 | Wu et al. | |
| 2021/0226416 A1* | 7/2021 | Daryoush | H01S 5/06256 |

FOREIGN PATENT DOCUMENTS

| | | |
|---|---|---|
| CN | 108879309 A | 11/2018 |
| CN | 108879310 A | 11/2018 |
| GB | 2561426 A | 10/2018 |
| JP | 2012174938 A | 9/2012 |

* cited by examiner

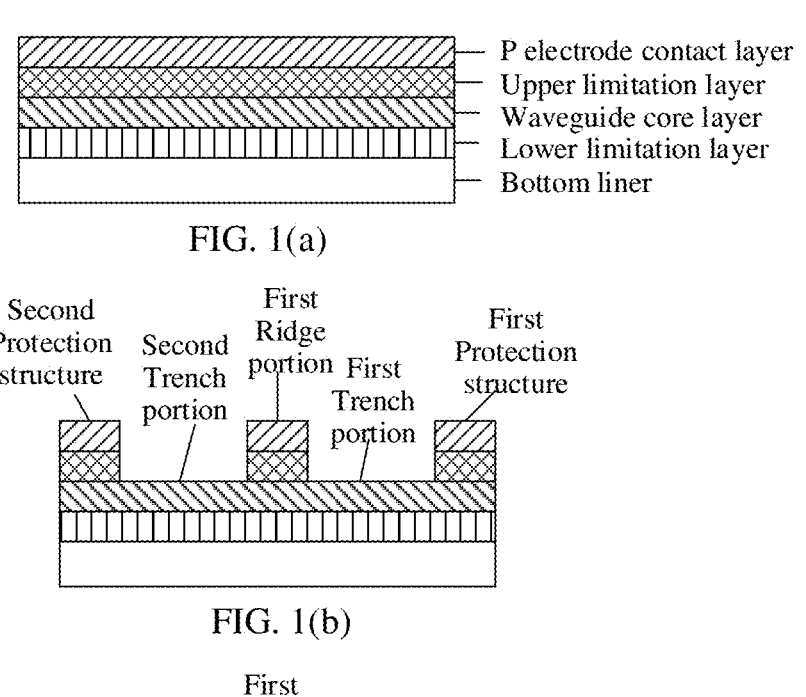

— P electrode contact layer
— Upper limitation layer
— Waveguide core layer
— Lower limitation layer
— Bottom liner

FIG. 1(a)

Second Protection structure   Second Trench portion   First Ridge portion   First Trench portion   First Protection structure

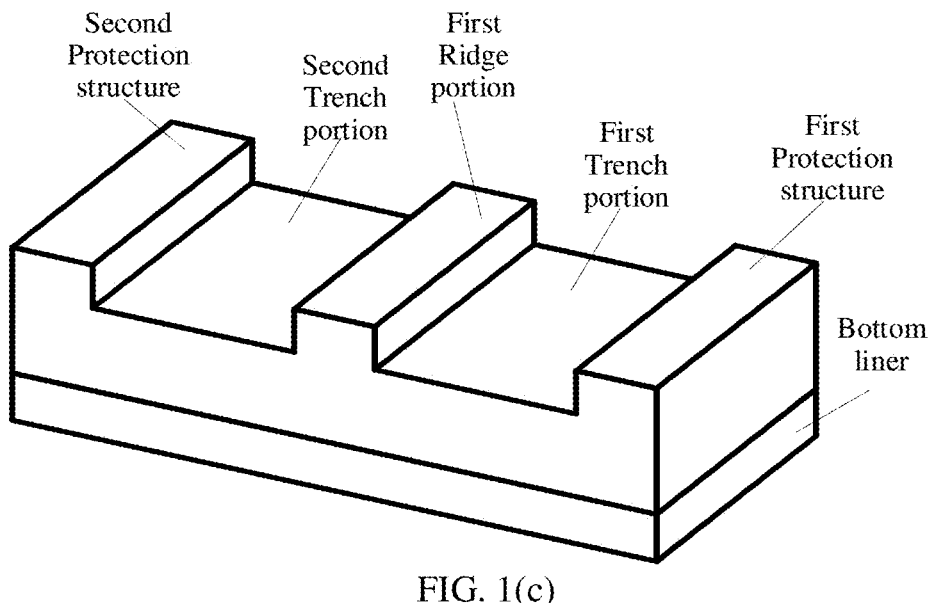

FIG. 1(b)

Second Protection structure   Second Trench portion   First Ridge portion   First Trench portion   First Protection structure   Bottom liner

FIG. 1(c)

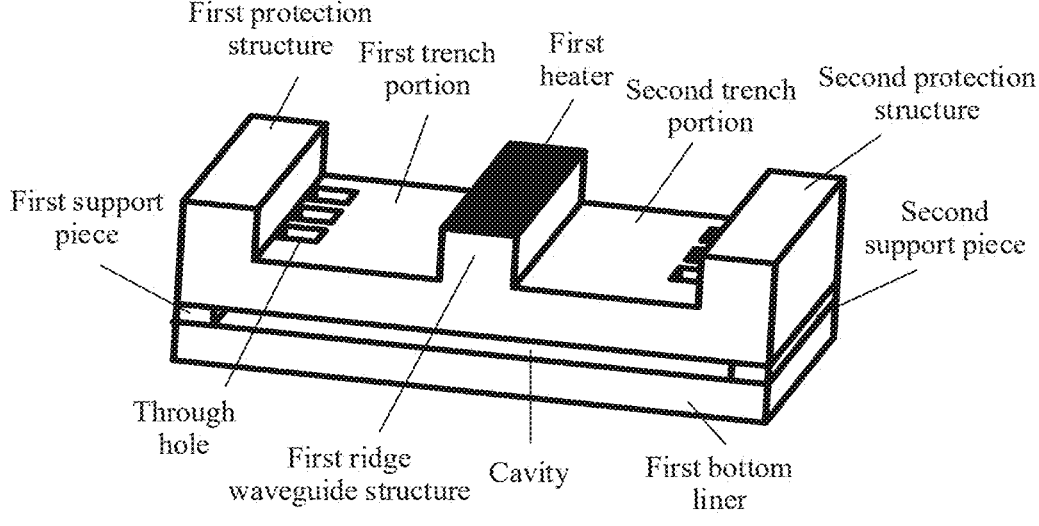

First protection structure
First trench portion
First heater
Second trench portion
Second protection structure
First support piece
Second support piece
Through hole
First ridge waveguide structure
Cavity
First bottom liner

FIG. 6(a)

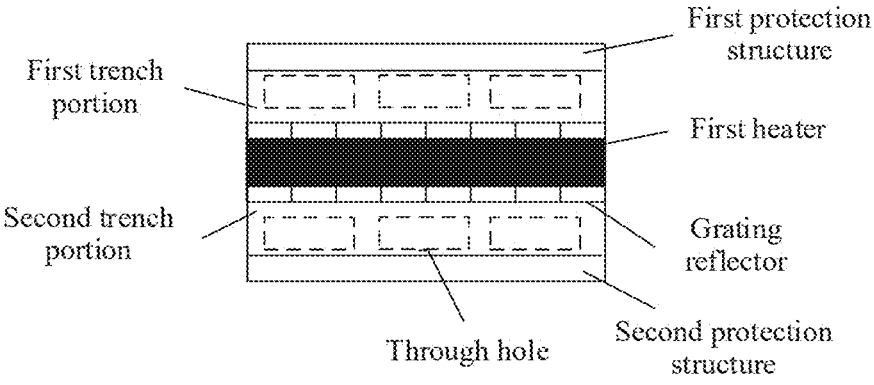

First trench portion
First protection structure
First heater
Second trench portion
Grating reflector
Through hole
Second protection structure

FIG. 6(b)

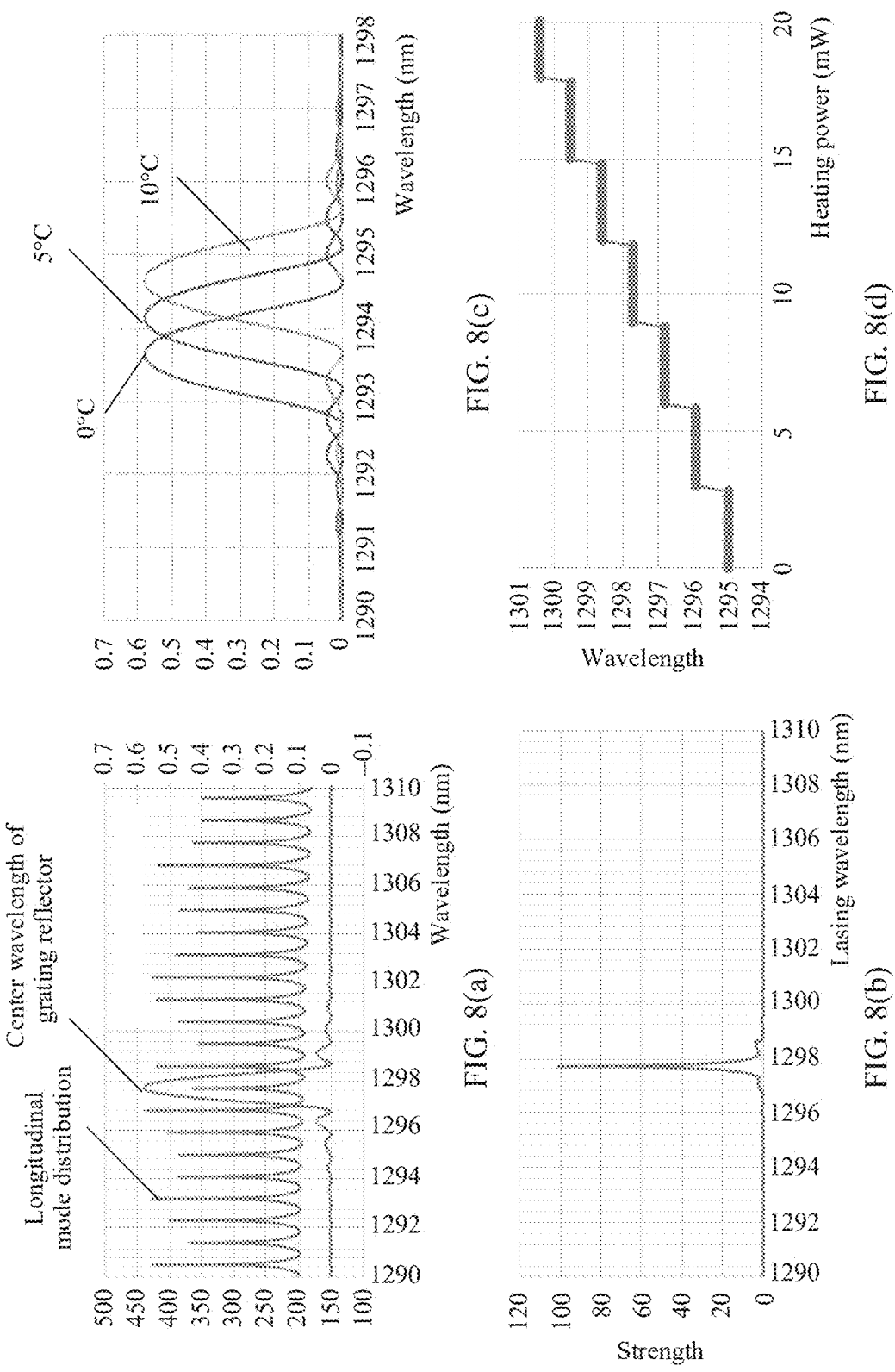

Reference light arm

Signal light arm

Second heater

Second ridge waveguide structure

Second support structure

Fourth bottom liner

Cavity

TWO-SEGMENT DBR LASER AND MONOLITHICALLY INTEGRATED ARRAY LIGHT SOURCE CHIP

CROSS-REFERENCE TO RELATED APPLICATIONS

This application is a continuation of International Application No. PCT/CN2018/118147, filed on Nov. 29, 2018, which is hereby incorporated by reference in its entirety.

TECHNICAL FIELD

This application relates to the field of optical communications, and in particular, to a two-segment distributed bragg reflector (DBR) laser and a monolithically integrated array light source chip.

BACKGROUND

In a local area network wavelength division multiplexing (LWDM) system, for a conventional light source, a distributed feedback bragg (DFB) laser is usually used as a basic light source. A structure characteristic of the DFB laser determines that a yield and power consumption cannot be both considered for the DFB laser. A single-mode yield and a wavelength alignment yield that are of the DFB laser are main factors that limit chip costs of the DFB laser. A tunable laser has a high single-mode yield and a high wavelength alignment yield, and is more suitable as a candidate light source of an integrated chip. Usually, work modes of the tunable laser include electric tuning and thermal tuning. The electric tuning causes an additional insertion loss, affecting component performance. However, in the thermal tuning, a heater is usually disposed on a surface of a waveguide structure of an optical chip to heat the waveguide structure, to change reflectivity of some materials in the waveguide structure, thereby implementing adjustment of a phase and a wavelength of a light wave transmitted in the waveguide structure. However, when the heater performs heating, heat usually scatters, and consequently thermal tuning efficiency is relatively low. In addition, the heat may scatter to other parts of an optical component, and consequently thermal crosstalk to the other parts is caused.

SUMMARY

This application provides a two-segment DBR laser and a monolithically integrated array light source chip, to increase thermal tuning efficiency and reduce heat crosstalk.

According to a first aspect, this application provides a two-segment DBR laser, including a grating region, a gain region, and a broadband reflector. The grating region and the broadband reflector are respectively disposed at two ends of the gain region. The grating region includes a first bottom liner, a first support structure, a first ridge waveguide structure, and a first heater. The first ridge waveguide structure is fastened by the first support structure and suspended in midair above the first bottom liner, and the first bottom liner, the first support structure, and the first ridge waveguide structure jointly form a cavity. The first heater is located on a surface that is of the first ridge waveguide structure and that faces away from the cavity.

According to the two-segment DBR laser provided in this application, the first bottom liner, the first support structure, and the first ridge waveguide structure of the grating region jointly form the cavity, so that when the first heater performs heating, the first support structure can achieve heat isolation and concentrate heat within the cavity, thereby reducing heat scattering. On one hand, heat can be concentrated to heat the first ridge waveguide structure, increasing tuning efficiency of the first heater. On the other hand, heat crosstalk to the gain region is reduced, and it is ensured that quantum efficiency of the gain region is not affected.

In a possible design, the first support structure includes a first support piece and a second support piece. One end of the first support piece and one end of the second support piece are fastened on a side surface that is of the first bottom liner and that faces toward the first ridge waveguide structure, and are located at two ends, away from each other, of the side surface that is of the first bottom liner and that faces toward the first ridge waveguide structure. The first ridge waveguide structure is fastened at the other end that is of the first support piece and that is away from the first bottom liner and at the other end that is of the second support piece and that is away from the first bottom liner.

In the foregoing possible design, the first support piece and the second support piece are disposed to serve as the first support structure, so that the cavity is conveniently formed.

In a possible design, a height of the first support piece is equal to a height of the second support piece.

In a possible design, the first ridge waveguide structure includes a first ridge portion, a first trench portion, a second trench portion, a first protection structure, and a second protection structure. The first protection structure is opposite to the second protection structure. The first trench portion is located between the first ridge portion and the first protection structure, and the second trench portion is located between the first ridge portion and the second protection structure. A distance between two opposite side walls of the first support piece and the second support piece is greater than a distance between two opposite side walls of the first protection structure and the second protection structure.

In the foregoing possible design, the distance between the two opposite side walls of the first support piece and the second support piece is increased, so that the cavity has relatively large space, further increasing the tuning efficiency of the first heater.

In a possible design, the first trench portion and/or the second trench portion is provided with at least one through hole, and the at least one through hole is in connection to the cavity. Specifically, the first trench portion is provided with the at least one through hole, or the second trench portion is provided with the at least one through hole, or the first trench portion and the second trench portion are both provided with the at least one through hole.

In the foregoing possible design, the at least one through hole is provided, so that a flow path of the heat concentrated within the cavity can be controlled to an extent, and the heat can further be concentrated within the first ridge waveguide structure, providing the tuning efficiency of the first heater.

In a possible design, the first heater is a metal resistor thin film, and the metal resistor thin film adheres to the surface that is of the first ridge waveguide structure and that faces away from the cavity.

In a possible design, an insulation layer is disposed between the first heater and the first ridge waveguide structure.

According to a second aspect, this application provides a monolithically integrated array light source chip, including N integrated monolithics. Each of the N integrated monolithics includes a second bottom liner, and a four-channel laser array integrated on the second bottom liner, and N is an integer greater than or equal to 1. The four-channel laser array includes four two-segment DBR lasers according to the first aspect or any optional manner of the first aspect.

According to the monolithically integrated array light source chip provided in this application, compared with that an overall yield of DFB lasers in a conventional monolithically integrated array light source chip is less than 50%, the two-segment DBR lasers used in the monolithically integrated array light source chip provided in embodiments of the present invention can implement 100% wavelength alignment and single-mode selection, and therefore can ensure an overall yield of the monolithically integrated array light source chip, reducing costs.

In a possible design, a functional device array is further integrated at a light output end located at the four-channel laser array on the second bottom liner, and the functional device array includes at least one of a modulator array, an amplifier array, and a detector array.

In the foregoing possible design, the functional device array is disposed, so that a function of the monolithically integrated array light source chip can be extended. To be specific, the function of the monolithically integrated array light source chip provided in the embodiments of the present invention has extendability.

In a possible design, when N is an integer greater than 1, the monolithically integrated array light source chip further includes a third bottom liner, and the N integrated monolithics are integrated in parallel on the third bottom liner.

According to a third aspect, this application provides an MZI, including a reference light arm and a signal light arm. The signal light arm includes a fourth bottom liner, a second support structure, a second ridge waveguide structure, and a second heater. The second ridge waveguide structure is fastened by the second support structure and suspended in midair above the fourth bottom liner, and the fourth bottom liner, the second support structure, and the second ridge waveguide structure jointly form a cavity. The second heater is located on a surface that is of the second ridge waveguide structure and that faces away from the cavity.

According to the MZI provided in this application, when the second heater performs heating, the second support structure can achieve heat isolation and concentrate heat within the cavity between the fourth bottom liner, the second support structure, and the second ridge waveguide structure, to heat the second ridge waveguide structure. It is verified by a test that a heat isolation structure is used, so that tuning efficiency is improved to $\pi/6$ mW, and is higher than that in a conventional MZI thermal tuning solution (to be specific, the heater is disposed on the second ridge waveguide structure, and no heat isolation is performed). In addition, less heat is scattered to the reference light arm to cause heat crosstalk to the reference light arm.

In a possible design, the second support structure includes a third support piece and a fourth support piece. One end of the third support piece and one end of the fourth support piece are fastened on a side surface that is of the fourth bottom liner and that faces toward the second ridge waveguide structure, and are located at two ends, away from each other, of the side surface that is of the fourth bottom liner and that faces toward the second ridge waveguide structure. The second ridge waveguide structure is fastened at the other end that is of the third support piece and that is away from the fourth bottom liner and at the other end that is of the fourth support piece and that is away from the fourth bottom liner.

In the foregoing possible design, the third support piece and the fourth support piece are disposed to serve as the second support structure, so that the cavity is conveniently formed.

In a possible design, a height of the third support piece is equal to a height of the fourth support piece.

In a possible design, the second ridge waveguide structure includes a second ridge portion, a third trench portion, a fourth trench portion, a third protection structure, and a fourth protection structure. The third protection structure is opposite to the second protection structure. The third trench portion is located between the second ridge portion and the third protection structure, and the fourth trench portion is located between the second ridge portion and the fourth protection structure. A distance between two opposite side walls of the third support piece and the fourth support piece is greater than a distance between two opposite side walls of the third protection structure and the fourth protection structure.

In the foregoing possible design, the distance between the two opposite side walls of the third support piece and the fourth support piece is increased, so that the cavity has relatively large space, further increasing the tuning efficiency of the second heater.

In a possible design, the third trench portion and/or the fourth trench portion is provided with at least one through hole, and the at least one through hole is in connection to the cavity. Specifically, the third trench portion is provided with the at least one through hole, or the fourth trench portion is provided with the at least one through hole, or the third trench portion and the fourth trench portion are both provided with the at least one through hole.

In the foregoing possible design, the at least one through hole is provided, so that a flow path of the heat concentrated within the cavity can be controlled to an extent, and the heat can further be concentrated within the second ridge waveguide structure, providing the tuning efficiency of the second heater.

In a possible design, the second heater is a metal resistor thin film, and the metal resistor thin film adheres to the surface that is of the second ridge waveguide structure and that faces away from the cavity.

In a possible design, an insulation layer is disposed between the second heater and the second ridge waveguide structure.

According to a fourth aspect, this application provides an optical multiplexer, including a two-stage cascaded Mach-Zehnder interferometer MZI. A first stage includes a first MZI and a second MZI, and a second stage includes a third MZI. At least one MZI of the first MZI, the second MZI, and the third MZI is the MZI according to the third aspect or any optional implementation of the third aspect. Two input ends of the first MZI and two input ends of the second MZI are four input ends of the optical multiplexer. An output end of the first MZI is connected to one input end of the third MZI. An output end of the second MZI is connected to the other input end of the third MZI. An output end of the third MZI is an output end of the optical multiplexer.

It is verified by a test that, compared with an over-6 dB multiplexing loss of a multi-mode interference (multi-mode interference, MMI) optical multiplexer, a multiplexing loss of the cascaded MZI optical multiplexer provided in this application is less than 2.5 dB. In addition, compared with a conventional discrete optical multiplexer (for example, a free space coupler or a planar optical waveguide coupler), the optical multiplexer monolithically integrated by the two-stage cascaded MZI provided in this application can greatly reduce a difficulty of device coupling and encapsulation, reduce a coupling insertion loss, and implement low costs and high performance.

In a possible design, free spectral ranges FSRs of the first MZI and the second MZI are twice an FSR of the third MZI.

According to a fifth aspect, this application provides a monolithically integrated array light source chip, including N integrated monolithics. Each of the N integrated monolithics includes a second bottom liner, and a four-channel laser array, an optical multiplexer, and a connection structure that are integrated on the second bottom liner. Four light output ends of the four-channel laser array one-to-one correspond to four input ends of the optical multiplexer. Each light output end is connected to the corresponding input end by using the connection structure. N is an integer greater than or equal to 1. The four-channel laser array includes four two-segment DBR lasers according to the first aspect or any implementation of the first aspect, and the optical multiplexer is the optical multiplexer according to the fourth aspect or any optional implementation of the fourth aspect.

According to the monolithically integrated array light source chip provided in this application, a plurality of two-segment DBR lasers and the optical multiplexer are integrated, so that one monolithically integrated array light source chip can implement multiplexing and outputting of a plurality of light waves with different wavelengths. On one hand, the monolithically integrated array light source chip can replace at least 14 discrete components in a conventional multi-wavelength transmitter optical subassembly (transmitter optical subassembly, TOSA), greatly reducing a quantity of optical components that need to be encapsulated and coupled, and thereby reducing complexity and costs of optical encapsulation.

On the other hand, compared with that an overall yield of DFB lasers in the conventional multi-wavelength TOSA is less than 50%, the two-segment DBR lasers used in the monolithically integrated array light source chip provided in this application can implement 100% wavelength alignment and single-mode selection, and therefore can ensure an overall yield of the monolithically integrated array light source chip, further reducing costs. In addition, compared with an over-6 dB multiplexing loss of an MMI optical multiplexer in the conventional multi-wavelength TOSA, a multiplexing loss of the cascaded MZI optical multiplexer used in the monolithically integrated array light source chip provided in the embodiments of the present invention is less than 2.5 dB, so that an overall loss of the monolithically integrated array light source chip can be reduced.

In a possible design, when the connection structure includes two intersecting optical waveguide structures, the two intersecting optical waveguide structures include two first multi-mode interferences MMIs perpendicular to each other.

In the foregoing possible design, the two first MMIs perpendicular to each other serve as the two intersecting optical waveguide structures, to implement orthogonality of a link light wave, thereby preventing crosstalk.

In a possible design, on the second bottom liner, at least one of a modulator array, an amplifier array, and a detector array is further integrated between the four light output ends located at the four-channel laser array and the four input ends of the optical multiplexer.

In the foregoing possible design, the functional device array is disposed, so that a function of the monolithically integrated array light source chip can be extended. To be specific, the function of the monolithically integrated array light source chip provided in the embodiments of the present invention has extendability.

In a possible design, when N is an integer greater than 1, the monolithically integrated array light source chip further includes a third bottom liner and a second MMI. The N integrated monolithics are integrated in parallel on the third bottom liner. Output ends of the N optical multiplexers of the N integrated monolithics are one-to-one connected to N input ends of the second MMI. The second MMI is configured to multiplex and output N light waves that are output by the N optical multiplexers.

BRIEF DESCRIPTION OF THE DRAWINGS

FIG. 1(a), FIG. 1(b), and FIG. 1(c) are a schematic diagram of a waveguide structure according to an embodiment of this application;

FIG. 6(a) and FIG. 6(b) are a schematic structural diagram of a grating region of still another two-segment DBR laser according to an embodiment of this application;

FIG. 8(a), FIG. 8(b), FIG. 8(c), and FIG. 8(d) are a schematic diagram of a working principle of a two-segment DBR laser according to an embodiment of this application;

DETAILED DESCRIPTION OF ILLUSTRATIVE EMBODIMENTS

Figure 2:
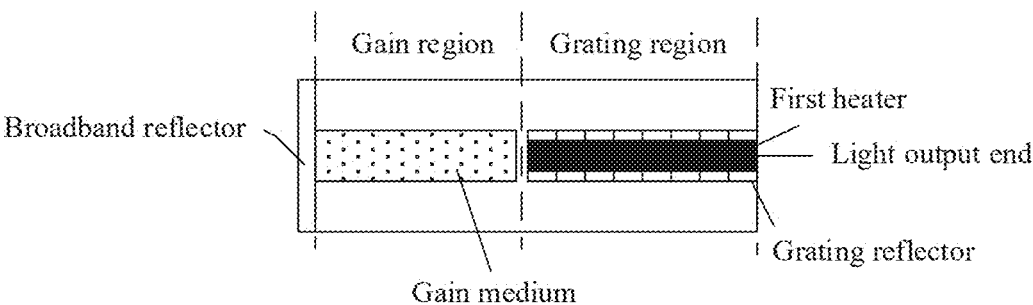
FIG. 2 is a top view of a two-segment DBR laser according to an embodiment of this application.

First, when the following mentions ordinals such as "first", "second", "third", or "fourth", the ordinal should be understood as only serving a purpose of distinguishing, unless the ordinal definitely expresses a meaning of sequence based on context.

Second, for a reader to easily understand a solution in this application, a ridge waveguide structure that will be provided in this application is first briefly described. The waveguide structure is generally disposed on a bottom liner whose material is indium phosphide (InP), and is a multi-layer structure including a waveguide core layer. For example, as shown in FIG. 1(a), in a sequence from a top layer to a bottom liner of the waveguide structure, the waveguide structure may sequentially include a P electrode contact layer, an upper limitation layer, a waveguide core layer, a lower limitation layer, and the like. The waveguide structure is a cuboid. Based on different application scenarios, the waveguide structure may further include a material layer having a special function. For example, in a waveguide structure of a grating region of a two-segment DBR laser, a grating reflector is further included above the waveguide core layer; and in a waveguide structure of a gain region of a two-segment DBR laser, a gain medium layer or the like is further included above the waveguide core layer. In addition, based on different application scenarios, the upper limitation layer and the lower limitation layer may include a plurality of layers of materials.

In this application, for a quantity of layers in the related waveguide structure (a first ridge waveguide structure and a second ridge waveguide structure that are to be related in the following) and a material of each layer, refer to manufacturing of a waveguide structure in an existing related optical component. Alternatively, a quantity of layers in the related waveguide structure (a first ridge waveguide structure and a second ridge waveguide structure that are to be related in the following) and a material of each layer are set based on an actual engineering requirement. This is not limited in this application.

To limit a shape of a light wave transmitted in a waveguide structure, the cuboid waveguide structure is usually set to a ridge waveguide structure. For example, the cuboid waveguide structure is corroded layer by layer from a top layer by using a corrosion solution corresponding to each layer of material, to form two trench structures, thereby forming the ridge waveguide structure. For example, as shown in FIG. 1(b), a waveguide structure is corroded from a top layer to an upper limitation layer by using a corrosion solution, to form a first trench portion and a second trench portion. A first ridge portion is located between the first trench portion and the second trench portion. Portions that are not corroded on two sides of the first trench portion and the second trench portion serve as protection structures. The first protection structure and the second protection structure are configured to disperse pressure on the first ridge portion, to prevent the first ridge portion from being crushed. A three-dimensional diagram of the ridge waveguide structure may be shown in FIG. 1(c).

In the following, a two-segment DBR laser and a monolithically integrated array light source chip that are provided in this application may be understood by referring to the ridge waveguide structure shown in FIG. 1(c).

As shown in FIG. 2, a two-segment DBR laser provided in this application includes a grating region, a gain region, and a broadband reflector. The grating region and the broadband reflector are respectively disposed at two ends of the gain region. A third ridge waveguide structure of the gain region includes a gain medium layer. The grating region is usually referred to as a DBR region, a grating mode selection region, or the like. A first ridge waveguide structure of the grating region includes a grating reflector. One end that is of the grating region and that is away from the broadband reflector is a light output end of the two-segment DBR laser.

Figure 3:
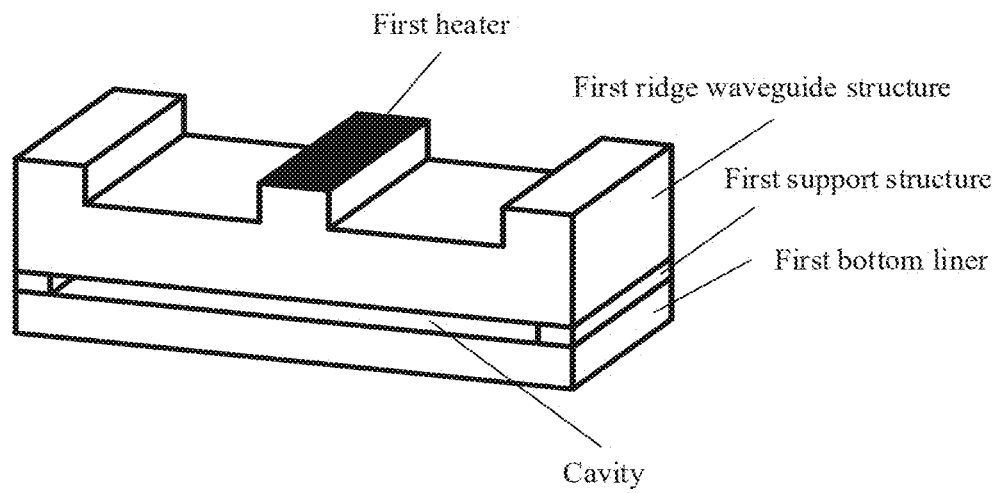
FIG. 3 is a schematic structural diagram of a grating region of a two-segment DBR laser according to an embodiment of this application.

As shown in FIG. 3, the grating region includes a first bottom liner, a first support structure, a first ridge waveguide structure, and a first heater. The first ridge waveguide structure is fastened by the first support structure and suspended in midair above the first bottom liner, and the first bottom liner, the first support structure, and the first ridge waveguide structure jointly form a cavity. The first heater is located on a surface that is of the first ridge waveguide structure and that faces away from the cavity.

The first support structure may include a first support piece and a second support piece. One end of the first support piece and one end of the second support piece are fastened on a side surface that is of the first bottom liner and that faces toward the first ridge waveguide structure, and are located at two ends, away from each other, of the side surface that is of the first bottom liner and that faces toward the first ridge waveguide structure. The first ridge waveguide structure is fastened at the other end that is of the first support piece and that is away from the first bottom liner and at the other end that is of the second support piece and that is away from the first bottom liner. A height of the first support piece is equal to a height of the second support piece.

Figure 4:
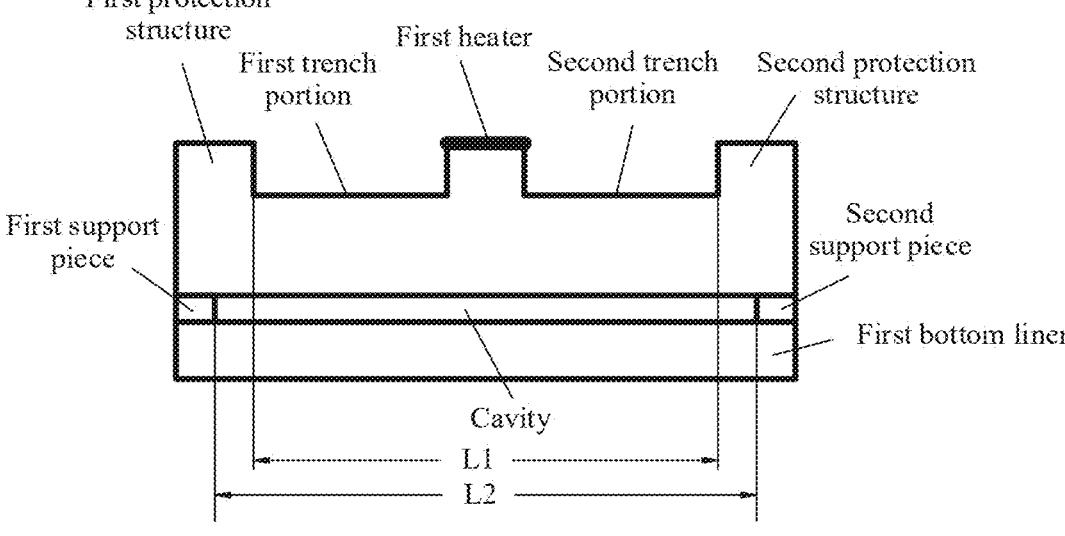
FIG. 4 is a schematic structural diagram of a grating region of another two-segment DBR laser according to an embodiment of this application.

As shown in FIG. 4, the first ridge waveguide structure may include a first ridge portion, a first trench portion, a second trench portion, a first protection structure, and a second protection structure. The first protection structure is opposite to the second protection structure. The first trench portion is located between the first ridge portion and the first protection structure, and the second trench portion is located between the first ridge portion and the second protection structure. A distance L2 between two opposite side walls of the first support piece and the second support piece may be greater than a distance L1 between two opposite side walls of the first protection structure and the second protection structure, to ensure that the cavity is large enough.

The cavity between the first bottom liner, the first support structure, and the first ridge waveguide structure may be implemented in a plurality of manners.

For example, a possible implementation is that, a one-layer or multi-layer structure that is closest to the first bottom liner and below a waveguide core layer in the first ridge waveguide structure is used as a sacrificial layer, a middle portion of the sacrificial layer is hollowed, portions that are not hollowed on two sides of the sacrificial layer are respectively used as the first support piece and the second support piece in the first support structure, to form the cavity.

For example, the middle portion of the sacrificial layer may be corroded by using a corrosion solution corresponding to the sacrificial layer.

Alternatively, another possible implementation is that, the first support piece and the second support piece in the first support structure are disposed between the first ridge waveguide structure and the first bottom liner, to form the cavity. For example, a sacrificial layer is disposed between the first support piece and the second support piece, and then the sacrificial layer is corroded by using a corrosion solution corresponding to the sacrificial layer. In this implementation, a material of the first support structure disposed between the first ridge waveguide structure and the first bottom liner may be indium phosphide (InP), and a material of the sacrificial layer may be a ternary compound semiconductor such as indium gallium arsenide (InGaAs) or indium aluminum arsenide (InAlAs).

Figures 5A, 5B, 5C:
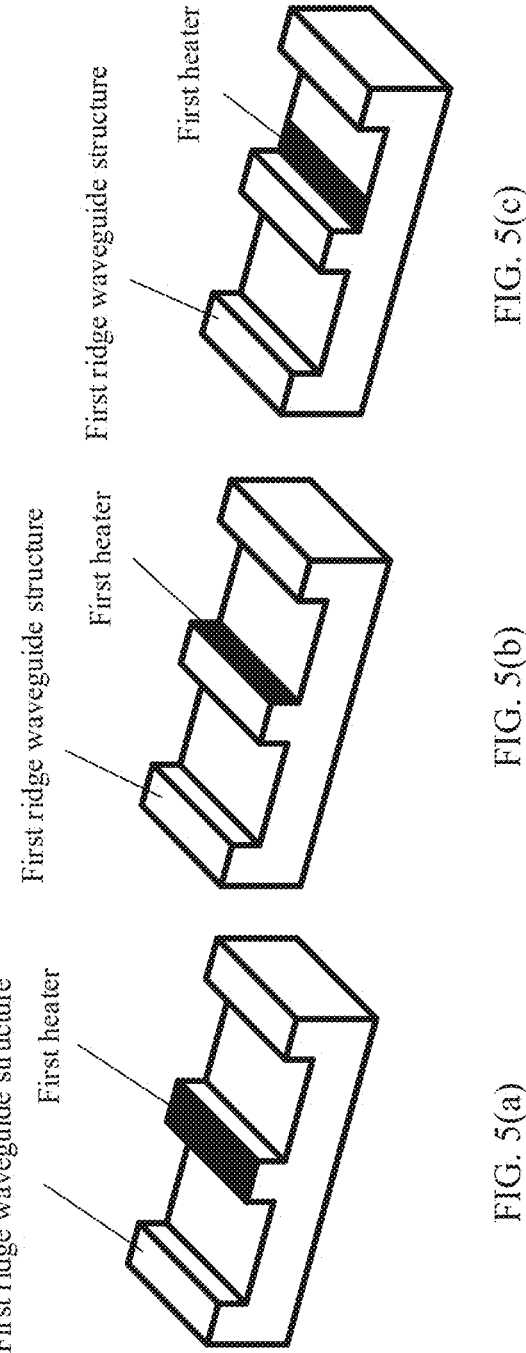
FIG. 5(a), FIG. 5(b), and FIG. 5(c) are a schematic diagram of a manner of disposing a first heater according to an embodiment of this application.

The first heater may be disposed on a surface that is of the first ridge waveguide structure and that faces away from the cavity, to provide thermal tuning to the grating reflector in the first ridge waveguide structure. For example, as shown in FIG. 5(a), the first heater may be disposed on a top layer of the first ridge portion. Alternatively, as shown in FIG. 5(b), the first heater may be disposed on a side wall of the first ridge portion. Alternatively, as shown in FIG. 5(c), the first heater may be disposed on a mesa of the first trench portion or the second trench portion. In an embodiment of this application, on a surface of the first ridge waveguide, the first heater may be disposed on side surfaces other than a side surface facing the first bottom liner. It should be learned that, the first heater may be located on any side surface or a plurality of side surfaces that are of the first ridge waveguide structure and that face away from the cavity.

The first heater may be platinum (Pt), or may be tantalum nitride (TaNx), or another metal resistor thin film. The metal resistor thin film adheres to the surface that is of the first ridge waveguide structure and that faces away from the cavity. Optionally, an insulation layer may further be disposed between the first heater and the first ridge waveguide structure, to insulate the first heater from the first ridge waveguide structure.

It may be understood that the first bottom liner, the first support structure, and the first ridge waveguide structure jointly form the cavity, so that when the first heater performs heating, the first support structure can achieve heat isolation and concentrate heat within the cavity, thereby reducing heat scattering. On one hand, heat can be concentrated to heat the first ridge waveguide structure, increasing tuning efficiency of the first heater. On the other hand, heat crosstalk to the gain region is reduced, and it is ensured that quantum efficiency of the gain region is not affected.

Optionally, the first trench portion and/or the second trench portion in the first ridge waveguide structure may be provided with at least one through hole, and the at least one through hole is in connection to the cavity. To be specific, the first trench portion is provided with the at least one through hole, or the second trench portion is provided with the at least one through hole, or the first trench portion and the second trench portion are both provided with the at least one through hole. For example, as shown in FIG. 6(a), the first trench portion and the second trench portion in the first ridge waveguide structure are each provided with three though holes in connection to the cavity. Optionally, as shown in FIG. 6(b), in the grating region of the two-segment DBR laser, the grating reflector is disposed above the waveguide core layer. Therefore, the three through holes provided in each of the first trench portion and the second trench portion may be provided on two sides of the grating reflector.

When the first heater performs heating, the at least one through hole can control, to an extent, a flow path of the heat concentrated within the cavity, and further concentrate the heat within the first ridge waveguide structure. In addition, in a process of manufacturing the cavity between the first bottom liner, the first support structure, and the first ridge waveguide structure, the at least one through hole may serve as a corrosion channel. The corrosion solution is poured into the at least one through hole to corrode the sacrificial layer between the first support structure and the first ridge waveguide structure, to form the cavity.

In the two-segment DBR laser, a resonant cavity is formed between the broadband reflector and the grating reflector, and is configured to generate light energy feedback, and a gain medium provides an optical gain, to form longitudinal mode distribution with an equal spacing. Each longitudinal mode corresponds to a light wave of one wavelength.

The broadband reflector may be covered with a high reflection (High Reflection, HR) film through vapor deposition, so that reflectivity of the broadband reflector is greater than 80%. The grating reflector may be covered with an antireflective film through vapor deposition, to reduce strength of reflected light, and increase strength of transmitted light.

Figures 7A, 7B, 7C:
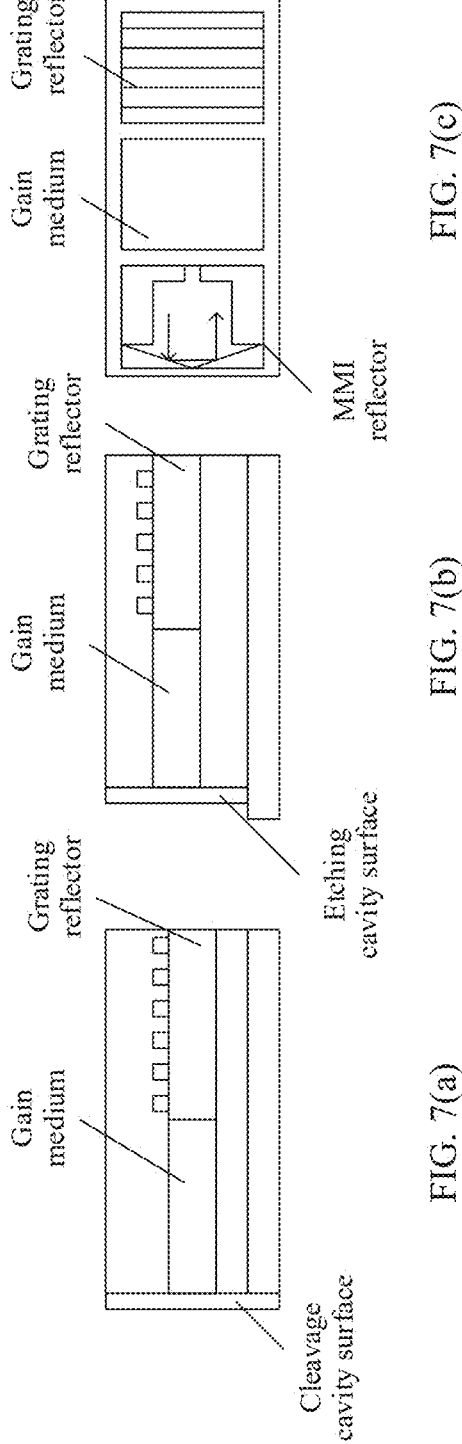
FIG. 7(a), FIG. 7(b), and FIG. 7(c) are a schematic diagram of a manner of disposing a broadband reflector of a two-segment DBR laser according to an embodiment of this application.

A structure of the broadband reflector may be a cleavage cavity surface shown in FIG. 7(a), may be an etching cavity surface shown in FIG. 7(b), or may be a multimode interference (MMI) reflector shown in FIG. 7(c), thereby ensuring that a coverage range of a center wavelength of the broadband reflector is greater than 50 nanometers (nm).

The grating reflector may be equivalent to a band-pass filter, and can allow a light wave whose wavelength is the same as the center wavelength of the grating reflector to pass through, and filter out a light wave whose wavelength is different from the center wavelength of the grating reflector. Therefore, when the center wavelength of the grating reflector matches a longitudinal mode mode provided by the gain region, a light wave corresponding to the longitudinal mode mode can pass through the grating reflector.

In a thermal tuning manner, the first heater (heater) is disposed in the grating region, and the grating reflector is heated by the first heater, to change reflectivity of the grating reflector, thereby adjusting the center wavelength of the grating reflector, and implementing selection of different longitudinal mode modes.

For example, FIG. 8(a), FIG. 8(b), FIG. 8(c), and FIG. 8(d) show a working principle of the two-segment DBR laser. FIG. 8(a) is a schematic diagram of selecting a longitudinal mode. When a longitudinal mode mode matching the center wavelength of the grating reflector exists in longitudinal mode distribution provided by the gain region, the grating reflector outputs a light wave corresponding to the matching longitudinal mode mode. FIG. 8(b) is a schematic diagram of a lasing wavelength of a light wave corresponding to a longitudinal mode mode matching a center wavelength of the grating reflector. FIG. 8(c) shows an example of a wavelength range of the grating reflector in different temperatures. FIG. 8(d) is a schematic diagram of a correspondence between heating power and a center wavelength of the grating reflector. The two-segment DBR laser may select a longitudinal mode in a wavelength range of 7 nm (to be specific, from 1295 nm to 1301 nm).

It should be noted that, in a process of mode selection by the two-segment DBR laser, only one longitudinal mode mode can be matched for the grating reflector each time, and therefore a single-mode yield of the two-segment DBR laser is 100%. In addition, in the thermal tuning manner, a longitudinal mode can be selected in a wavelength range greater than 5 nm, and therefore a wavelength alignment yield of the two-segment DBR laser may also reach 100%.

It should be noted that a structure of the grating region of the two-segment DBR laser provided in this application may also be applied to a three-segment DBR laser (including a gain region, a phase region, and a grating region), a four-segment DBR laser (including a gain region, a phase region, and two grating regions), or other types of DBR lasers.

Based on the two-segment DBR laser provided in this application, this application further provides a monolithically integrated array light source chip, including N integrated monolithics. Each of the N integrated monolithics includes a second bottom liner, and a four-channel laser array integrated on the second bottom liner, and N is an integer greater than or equal to 1.

The four-channel laser array includes four two-segment DBR lasers provided in this application. The second bottom liner may be a semiconductor material such as N-type indium phosphide (N—InP) or arsenic (Si).

Figure 9:
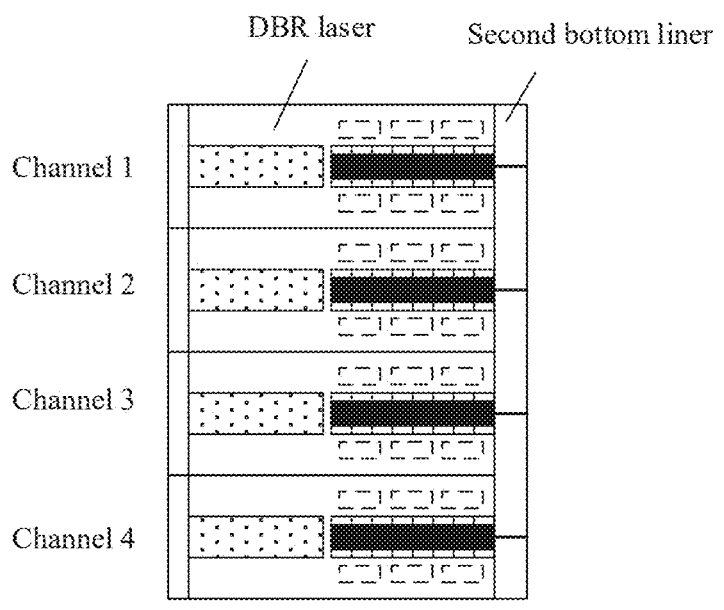
FIG. 9 is a schematic structural diagram 1 of a monolithically integrated array light source chip according to an embodiment of this application.

When N is 1, as shown in FIG. 9, the monolithically integrated array light source chip includes one integrated monolithic, and is a four-channel light source chip. Light wave outputs are respectively provided by one two-segment DBR laser to a channel 1, a channel 2, a channel 3, and a channel 4, so that four light waves with different wavelengths can be output.

Figure 10:
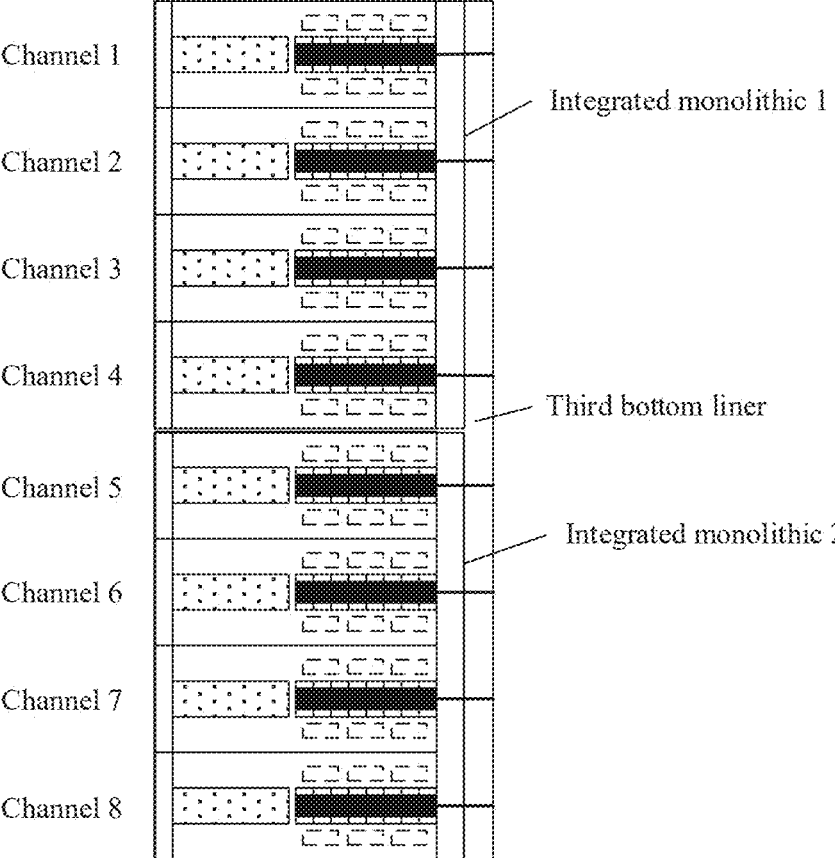
FIG. 10 is a schematic structural diagram 2 of a monolithically integrated array light source chip according to an embodiment of this application.
Figure 11A:
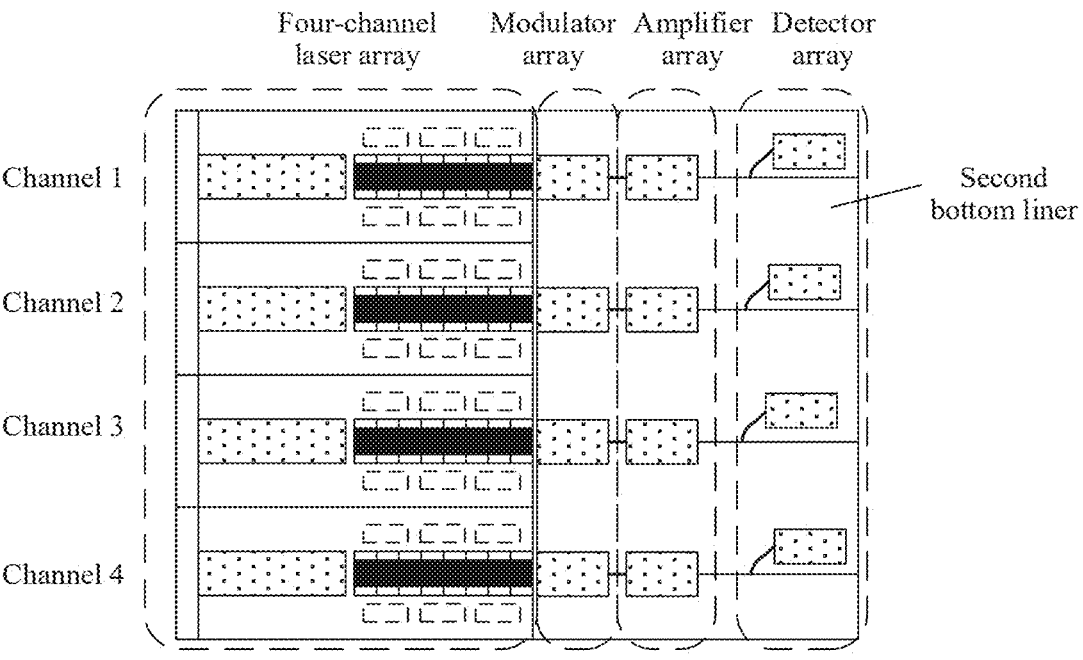
FIG. 11(a), FIG. 11(b), FIG. 11(c), and FIG. 11(d) are a schematic structural diagram 3 of a monolithically integrated array light source chip according to an embodiment of this application.
Figure 11B:
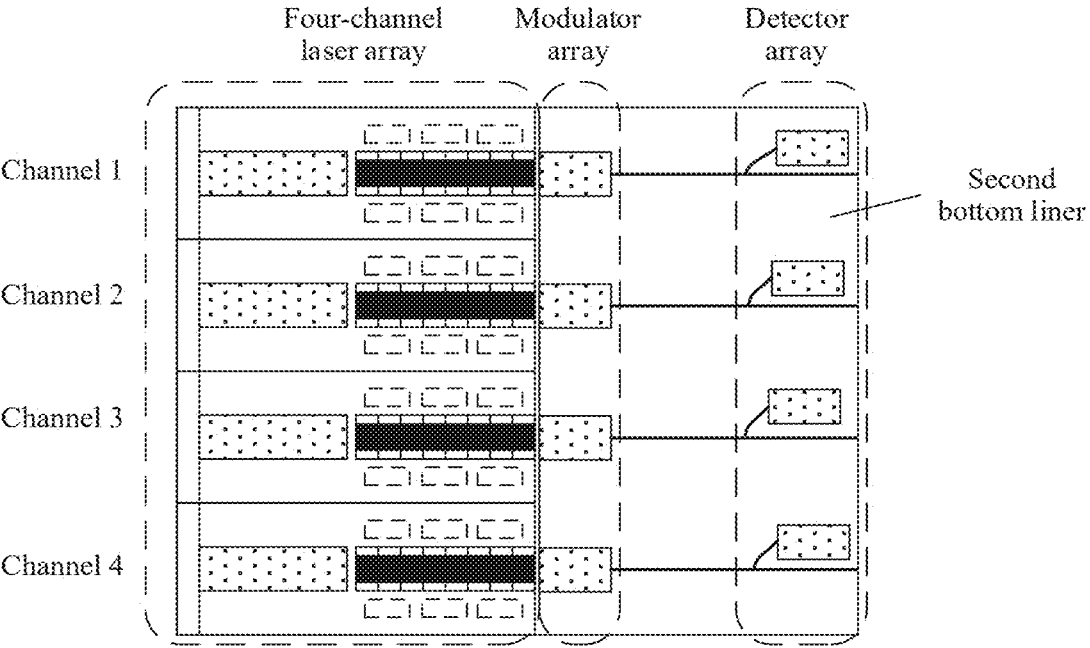
Figure 11C:
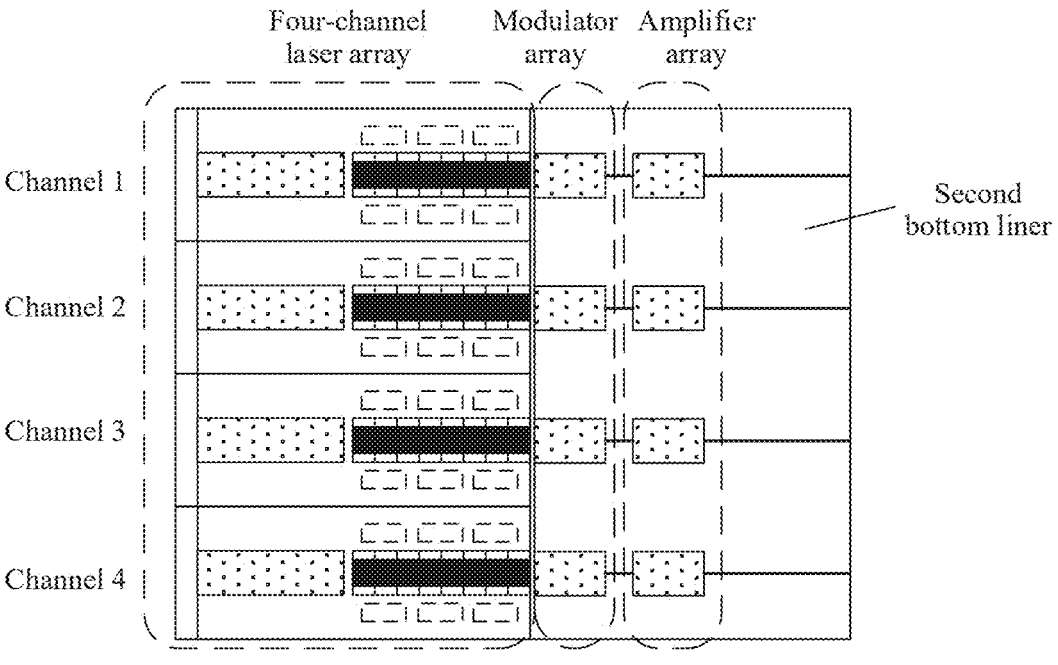
Figure 11D:
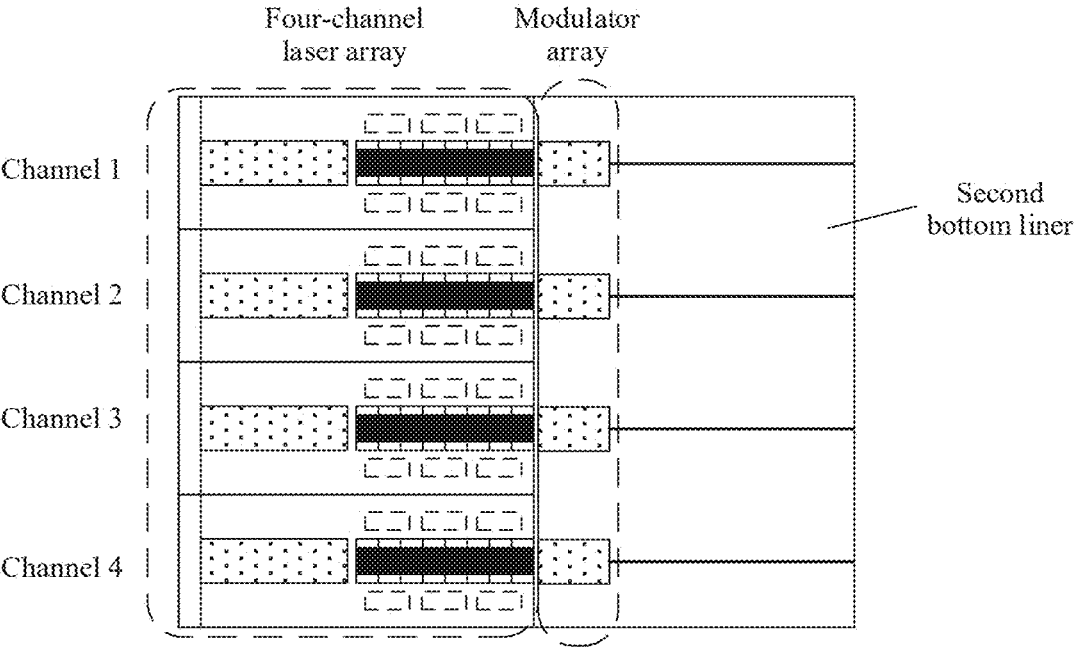

When N is an integer greater than 1, the monolithically integrated array light source chip further includes a third bottom liner, and the N integrated monolithics are integrated in parallel on the third bottom liner. For example, as shown in FIG. 10, when N=2, the monolithically integrated array light source chip is a light source chip with eight channels (to be specific, a channel 1, a channel 2, . . . , a channel 7, and a channel 8), and can output eight light waves with different wavelengths. The monolithically integrated array light source chip includes two integrated monolithics. An integrated monolithic 1 outputs light waves to first four channels (to be specific, the channel 1, the channel 2, the channel 3, and the channel 4). An integrated monolithic 2 outputs light waves to last four channels (to be specific, the channel 5, the channel 6, the channel 7, and the channel 8).

It should be noted that, compared with that an overall yield of DFB lasers in a conventional light source chip is less than 50%, the two-segment DBR lasers used in the monolithically integrated array light source chip provided in the embodiments of the present invention can implement 100% wavelength alignment and single-mode selection, and therefore can ensure an overall yield of the monolithically integrated array light source chip, reducing costs.

Optionally, a function of the monolithically integrated array light source chip provided in the embodiments of the present invention has extendability. For example, a functional device array may be integrated at a light output end of a four-channel laser array of each integrated monolithic, to extend the function of the monolithically integrated array light source chip. The functional device array may include one or more functional device arrays, such as a modulator array, an amplifier array, and a detector array. To be specific, the functional device array may include the modulator array, the amplifier array, or the detector array, or the functional device array may include the modulator array, the amplifier array, and the detector array, or the functional device array may include any two functional device arrays of the modulator array, the amplifier array, and the detector array.

For example, as shown in FIG. 11($a$), a modulator array, an amplifier array, and a detector array are integrated at a light output end of a four-channel laser array. Each functional device array includes four functional devices corresponding to four two-segment DBR lasers. A modulator in the modulator array may be an electro-absorption modulator (EAM), or may be an MZ modulator, and is configured to implement high-speed signal loading. An amplifier in the amplifier array is configured to perform power amplification on a light wave on a corresponding channel. A detector in the detector array is configured to perform power detection on a light wave on a corresponding channel.

As shown in FIG. 11($b$), a modulator array and a detector array are integrated at a light output end of a four-channel laser array.

As shown in FIG. 11($c$), a modulator array and an amplifier array are integrated at a light output end of a four-channel laser array.

As shown in FIG. 11($d$), a modulator array is integrated at a light output end of a four-channel laser array.

Figure 12:
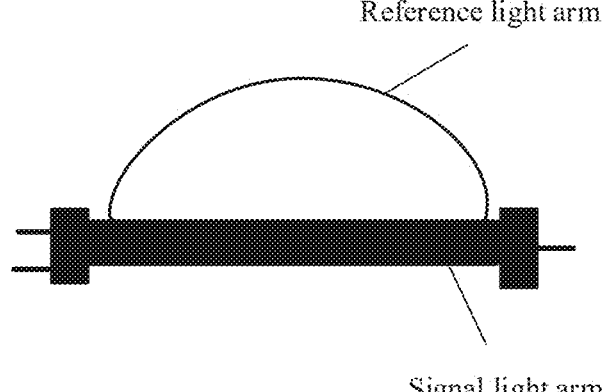
FIG. 12 is a schematic structural diagram of an MZI according to an embodiment of this application.

As shown in FIG. 12, this application provides an MZI, including a reference light arm and a signal light arm. The reference light arm is light waveguide used for transmitting reference light, and the signal light arm is light waveguide used for transmitting signal light. The signal light is a light wave that needs to be processed by the MZI. Also in a thermal tuning manner, for the MZI, a second heater is disposed on a second ridge waveguide structure of the signal light arm, and the second heater heats the second ridge waveguide structure, to change refractivity of a material in the second ridge waveguide structure, to adjust a phase of the signal light, thereby enabling the phase of the signal light to match a phase of the reference light.

Figure 13:
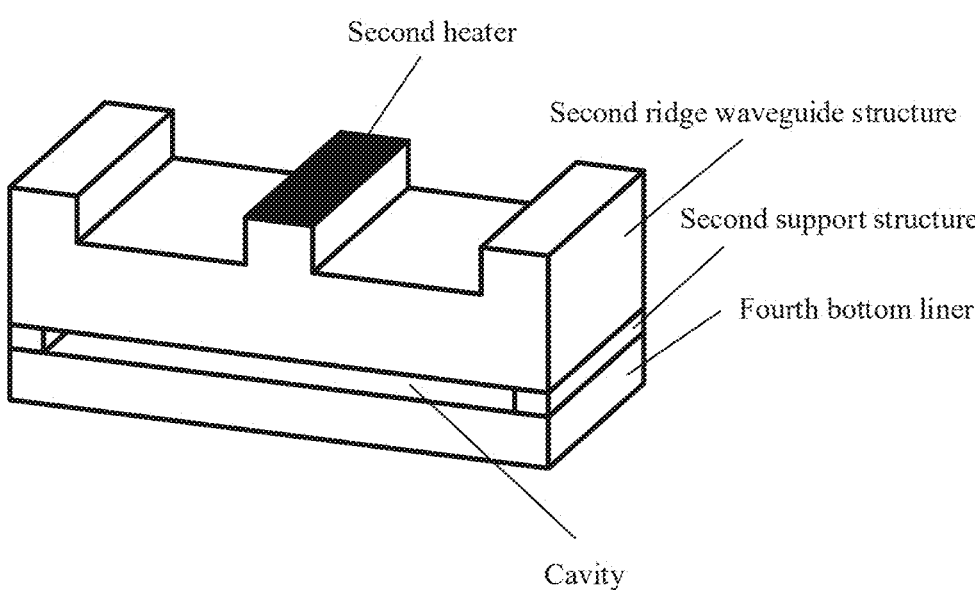
FIG. 13 is a schematic structural diagram of a signal light arm of an MZI according to an embodiment of this application.

In an embodiment of the present invention, as shown in FIG. 13, the signal light arm includes a fourth bottom liner, a second support structure, a second ridge waveguide structure, and a second heater. The second ridge waveguide structure is fastened by the second support structure and suspended in midair above the fourth bottom liner, and the fourth bottom liner, the second support structure, and the second ridge waveguide structure jointly form a cavity. The second heater is located on a surface that is of the second ridge waveguide structure and that faces away from the cavity.

The second support structure may include a third support piece and a fourth support piece. One end of the third support piece and one end of the fourth support piece are fastened on a side surface that is of the fourth bottom liner and that faces toward the second ridge waveguide structure, and are located at two ends, away from each other, of the side surface that is of the fourth bottom liner and that faces toward the second ridge waveguide structure. The second ridge waveguide structure is fastened at the other end that is of the third support piece and that is away from the fourth bottom liner and at the other end that is of the fourth support piece and that is away from the fourth bottom liner. A height of the third support piece is equal to a height of the fourth support piece.

Figure 14:
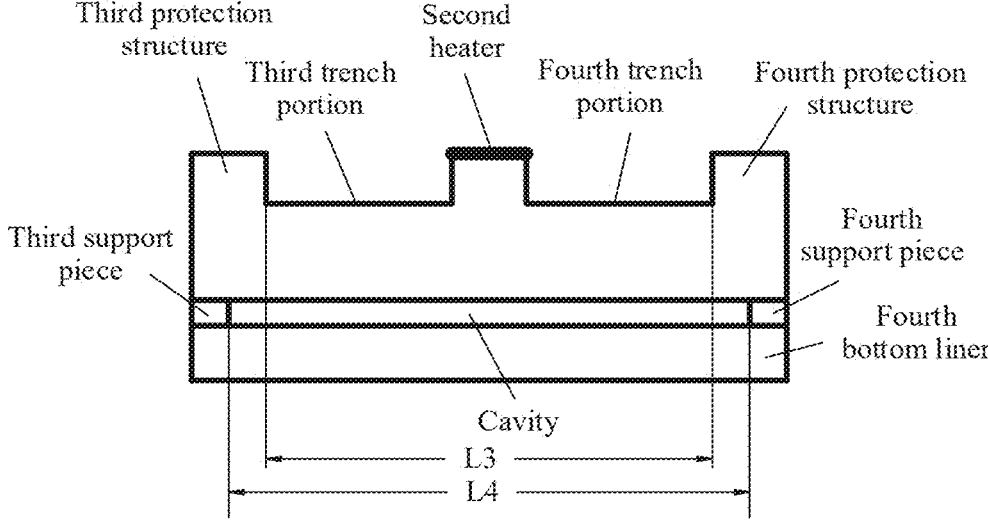
FIG. 14 is a schematic structural diagram of a signal light arm of another MZI according to an embodiment of this application.

As shown in FIG. 14, the second support structure includes a second ridge portion, a third trench portion, a fourth trench portion, a third protection structure, and a fourth protection structure. The third protection structure is opposite to the fourth protection structure. The third trench portion is located between the second ridge portion and the third protection structure, and the fourth trench portion is located between the second ridge portion and the fourth protection structure. A distance L4 between two opposite side walls of the third support piece and the fourth support piece is greater than a distance L3 between two opposite side walls of the third protection structure and the fourth protection structure, to ensure that the cavity is large enough.

When the second heater performs heating, the second support structure can achieve heat isolation and concentrate heat within the cavity between the fourth bottom liner, the second support structure, and the second ridge waveguide structure, to heat the second ridge waveguide structure. It is verified by a test that a heat isolation structure is used, so that tuning efficiency is improved to $\pi/6$ mW, and is higher than that in a conventional MZI thermal tuning solution (to be specific, the heater is disposed on the second ridge waveguide structure, and no heat isolation is performed). In addition, less heat is scattered to the reference light arm to cause heat crosstalk to the reference light arm.

For a manner of manufacturing the cavity between the fourth bottom liner, the second support structure, and the second ridge waveguide structure, refer to the manner of manufacturing the cavity between the first bottom liner, the first support structure, and the first ridge waveguide structure in the two-segment DBR laser. Details are not described herein again.

The second heater may be disposed on a surface that is of the second ridge waveguide structure and that faces away from the cavity, to provide thermal tuning to the second ridge waveguide structure. The second heater may be disposed on any side surface or a plurality of side surfaces different from a side surface facing toward the first bottom liner. For example, the second heater may be disposed on a top layer of the second ridge portion, on a side wall of the second ridge portion, or on a mesa of the first trench portion or the second trench portion. Optionally, the second heater may be Pt, or may be TaNx, or another metal resistor thin film. The metal resistor thin film adheres to the surface that is of the second ridge waveguide structure and that faces away from the cavity. Optionally, an insulation layer may further be disposed between the second heater and the second ridge waveguide structure, to insulate the second heater from the second ridge waveguide structure.

It should be noted that the MZI provided in this application may be a dual-input dual-output structure, a single-input dual-output structure, a dual-input single-output structure, or another type of structure. The MZI may be applied to an optical device, for example, an optical multiplexer or an optical demultiplexer. In FIG. 13, a structure with double inputs and a single output is used as an example.

Figure 15:
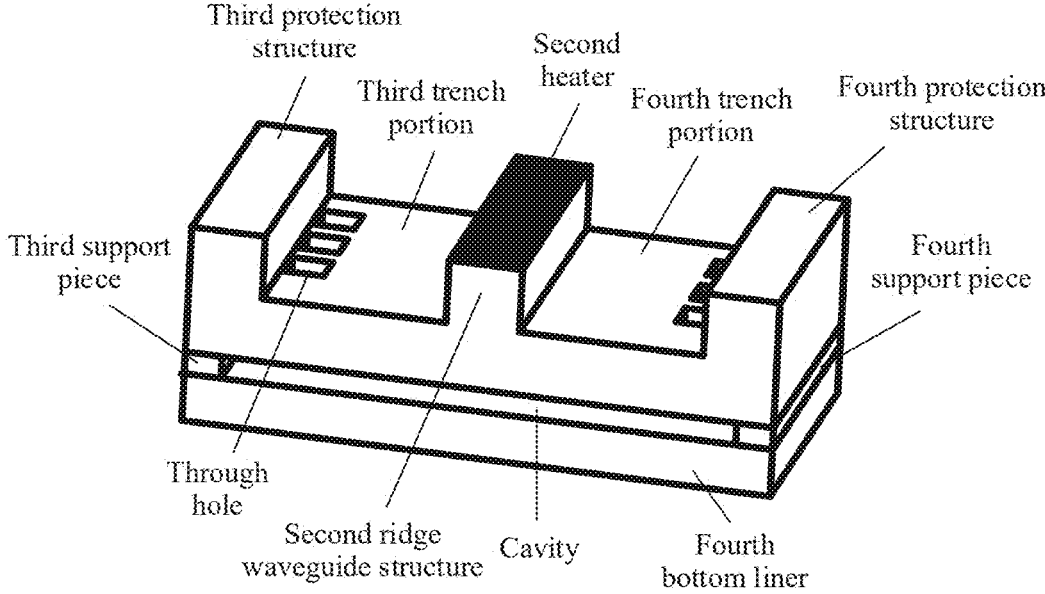
FIG. 15 is a schematic structural diagram of a signal light arm of still another MZI according to an embodiment of this application.

Optionally, the third trench portion and/or the fourth trench portion in the second ridge waveguide structure may be provided with at least one through hole, and the at least one through hole is in connection to the cavity. To be specific, the third trench portion is provided with the at least one through hole, the fourth trench portion is provided with the at least one through hole, or the third trench portion and the fourth trench portion are both provided with the at least one through hole. For example, as shown in FIG. 15, the third trench portion and the fourth trench portion in the second ridge waveguide structure are each provided with three though holes in connection to the cavity.

When the second heater performs heating, the at least one through hole can control, to an extent, a flow path of the heat concentrated within the cavity, and further concentrate the heat within the second ridge waveguide structure. In addition, in a process of manufacturing the cavity between the fourth bottom liner, the second support structure, and the second ridge waveguide structure, the at least one through hole may serve as a corrosion channel. The corrosion solution is poured into the at least one through hole to corrode the sacrificial layer between the second support structure and the second ridge waveguide structure, to form the cavity.

Figure 16:
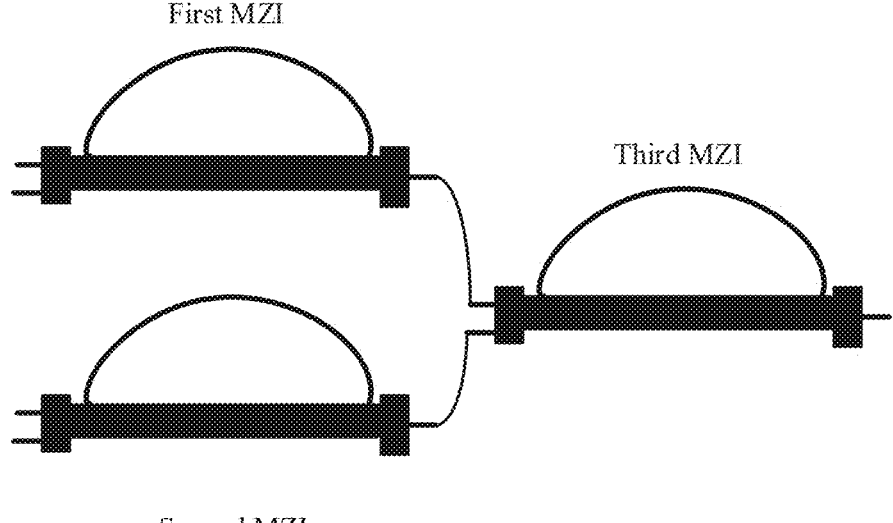
FIG. 16 is a schematic structural diagram of an optical multiplexer according to this application.

As shown in FIG. 16, this application further provides an optical multiplexer, including a two-stage cascaded MZI. A first stage includes a first MZI and a second MZI, and a second stage includes a third MZI. Two input ends of the first MZI and two input ends of the second MZI are four input ends of the optical multiplexer. An output end of the first MZI is connected to one input end of the third MZI. An output end of the second MZI is connected to the other input end of the third MZI. An output end of the third MZI is an output end of the optical multiplexer. At least one MZI of the first MZI, the second MZI, and the third MZI is the MZI provided in this application.

The input ends of the optical multiplexer may receive four light waves with different wavelengths. A free spectral range (FSR) is designed, and wavelengths of the four received light waves are respectively directed to maximum points of corresponding FSRs, to multiplex and output the four light waves with the different wavelengths.

In an example, free spectral ranges FSRs of first-stage MZIs (including the first MZI and the second MZI) may be twice an FSR of the third MZI.

Figures 17A, 17B:
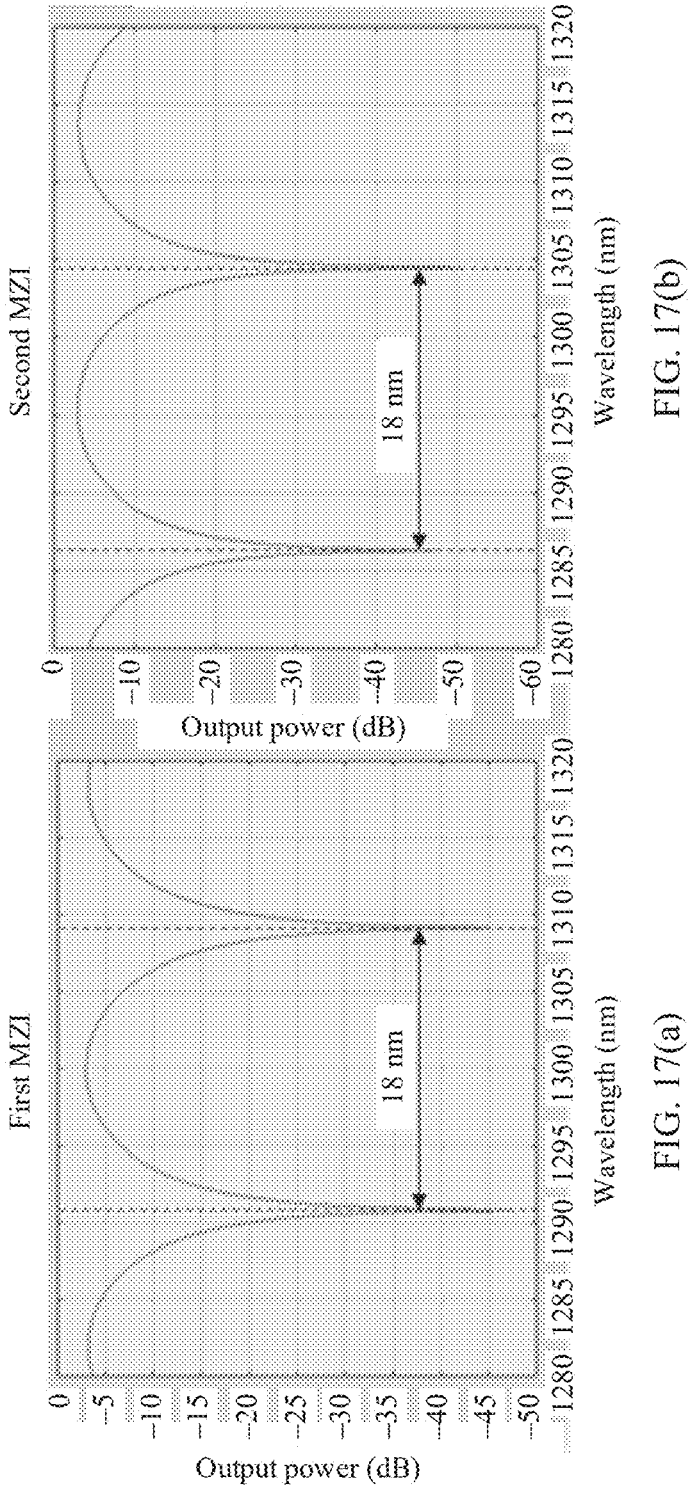
FIG. 17(a), FIG. 17(b), FIG. 17(c), and FIG. 17(d) are a schematic diagram of a working principle of an optical multiplexer according to an embodiment of this application.
Figures 17C, 17D:
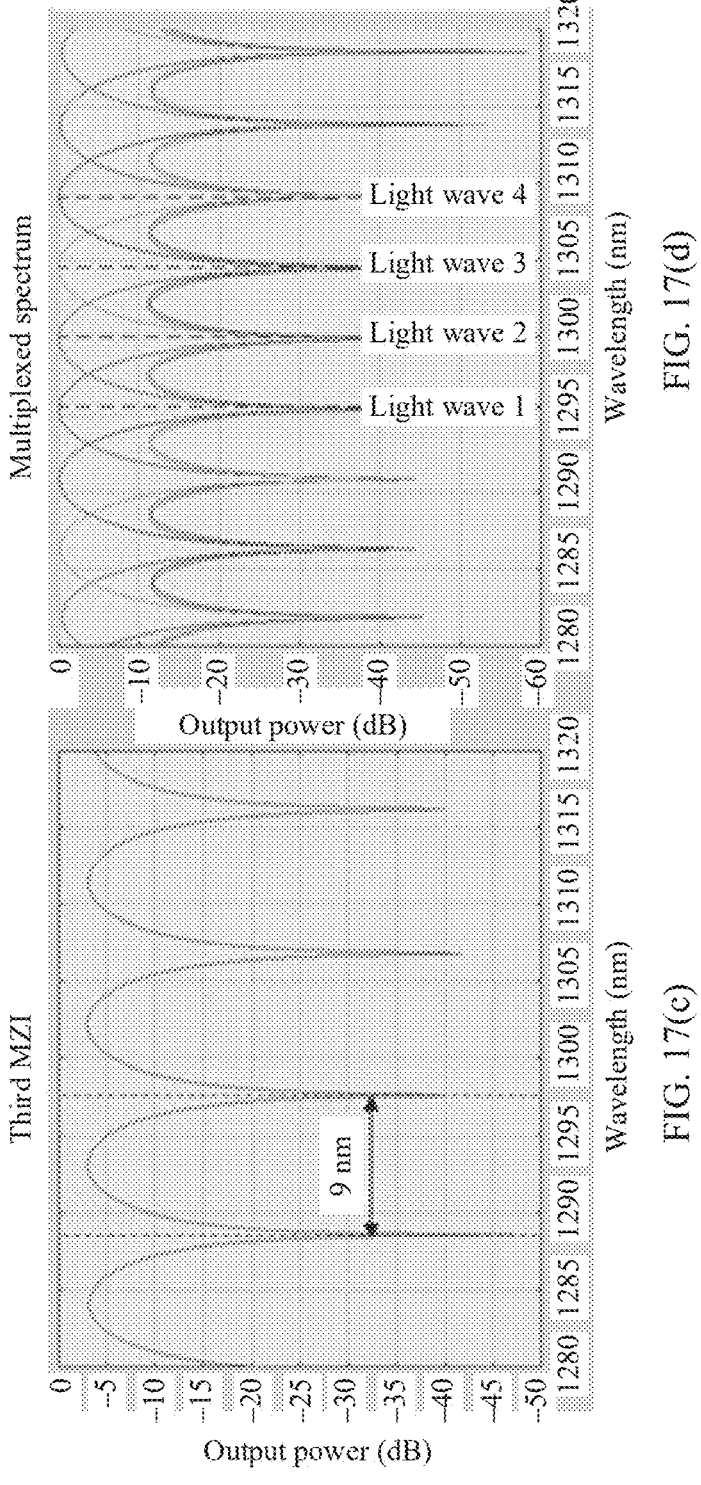

For example, it is assumed that an operating wavelength spacing of a received light wave is 4.5 nm. As shown in FIG. 17(a), an FSR of a first MZI is 18 nm. As shown in FIG. 17(b), an FSR of a second MZI is 18 nm. As shown in FIG. 17(c), an FSR of a third MZI is 9 nm. After received four light waves (a light wave 1, a light wave 2, a light wave 3, and a light wave 4) are multiplexed, a multiplexed spectrum of the light wave 1, the light wave 2, the light wave 3, and the light wave 4 is shown in FIG. 17(d).

It is verified by a test that, compared with an over-6 dB multiplexing loss of an MMI optical multiplexer, a multiplexing loss of the cascaded MZI optical multiplexer provided in the embodiments of the present invention is less than 2.5 dB. In addition, compared with a conventional discrete optical multiplexer (for example, a free space coupler or a planar optical waveguide coupler), the optical multiplexer monolithically integrated by the two-stage cascaded MZI provided in this application can greatly reduce a difficulty of device coupling and encapsulation, reduce a coupling insertion loss, and implement low costs and high performance.

It should be noted that both an MZI with a dual-input and dual-output structure and an MZI with a dual-input and single-output structure may be used in the optical multiplexer. In FIG. 16, the optical multiplexer provided in this application is described by using an example in which the MZI having a structure with double inputs and a single input is used as a constitutive device of the optical multiplexer.

Based on the two-segment DBR laser and the optical multiplexer provided in this application, this application further provides another monolithically integrated array light source chip, including N integrated monolithics. Each of the N integrated monolithics includes a second bottom liner, and a four-channel laser array, an optical multiplexer, and a connection structure that are integrated on the second bottom liner. Four light output ends of the four-channel laser array one-to-one correspond to four input ends of the optical multiplexer. Each light output end is connected to a corresponding input end by using a connection structure. N is an integer greater than or equal to 1.

The four-channel laser array includes four two-segment DBR lasers provided in this application. To be specific, a light wave output is provided by one two-segment DBR laser to each channel. The optical multiplexer is the two-stage cascaded MZI optical multiplexer provided in this application, and is configured to multiplex and output four light waves that are output by the four-channel laser array.

Figure 18:
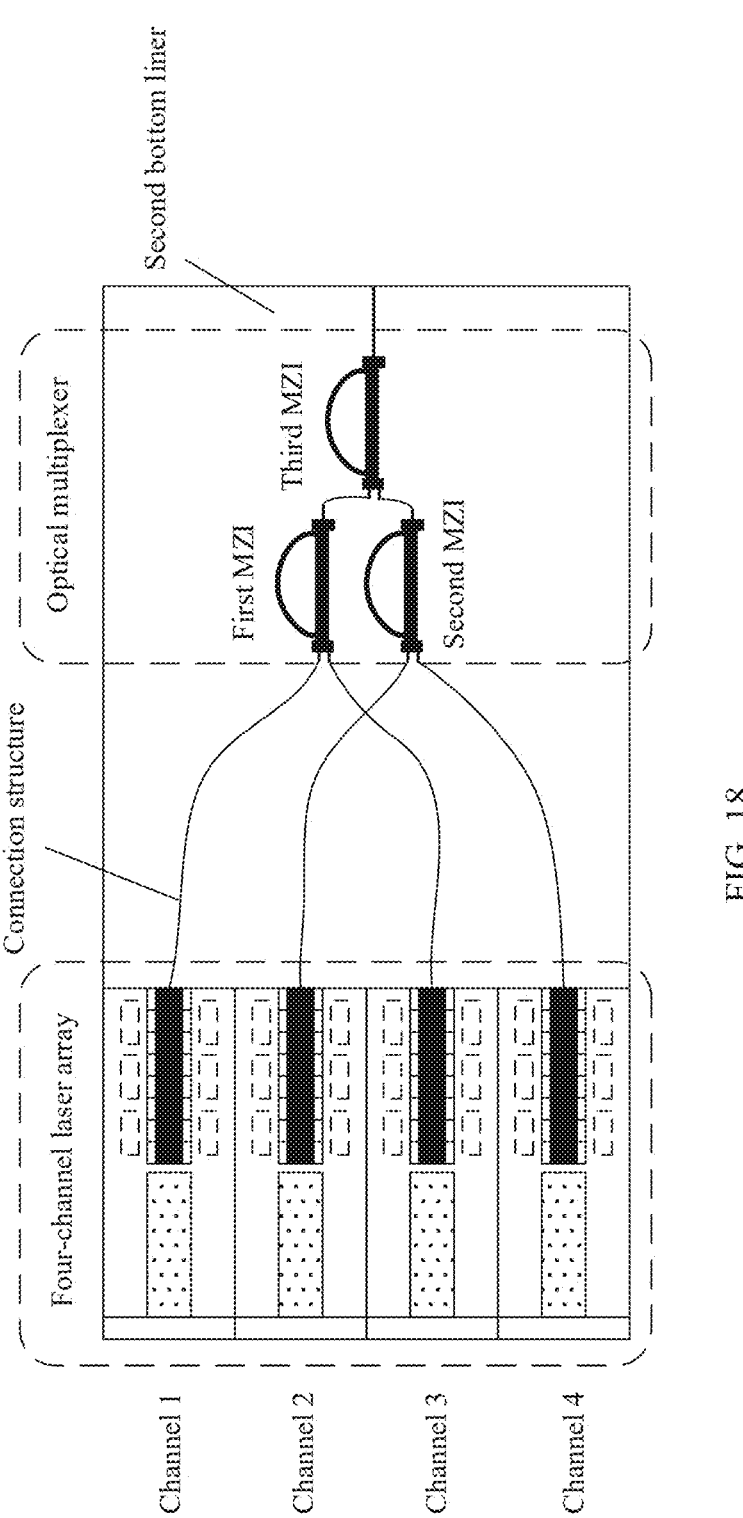
FIG. 18 is a schematic structural diagram 4 of a monolithically integrated array light source chip according to an embodiment of this application.

When N is 1, as shown in FIG. 18, the monolithically integrated array light source chip includes one integrated monolithic, and is a four-channel transmitter optical subassembly (TOSA), channels being respectively a channel 1, a channel 2, a channel 3, and a channel 4, so that four light waves with different wavelengths can be multiplexed and output.

When N is an integer greater than 1, the monolithically integrated array light source chip further includes a third bottom liner and a second MMI. The N integrated monolithics are integrated in parallel on the third bottom liner. Output ends of the N optical multiplexers of the N integrated monolithics are one-to-one connected to input ends of the second MMI. The second MMI is an optical multiplexer with an N×1 (namely, N input ends and one output end) structure, and is configured to multiplex and output N light waves output by the N optical multiplexers in the N integrated monolithics.

Figure 19:
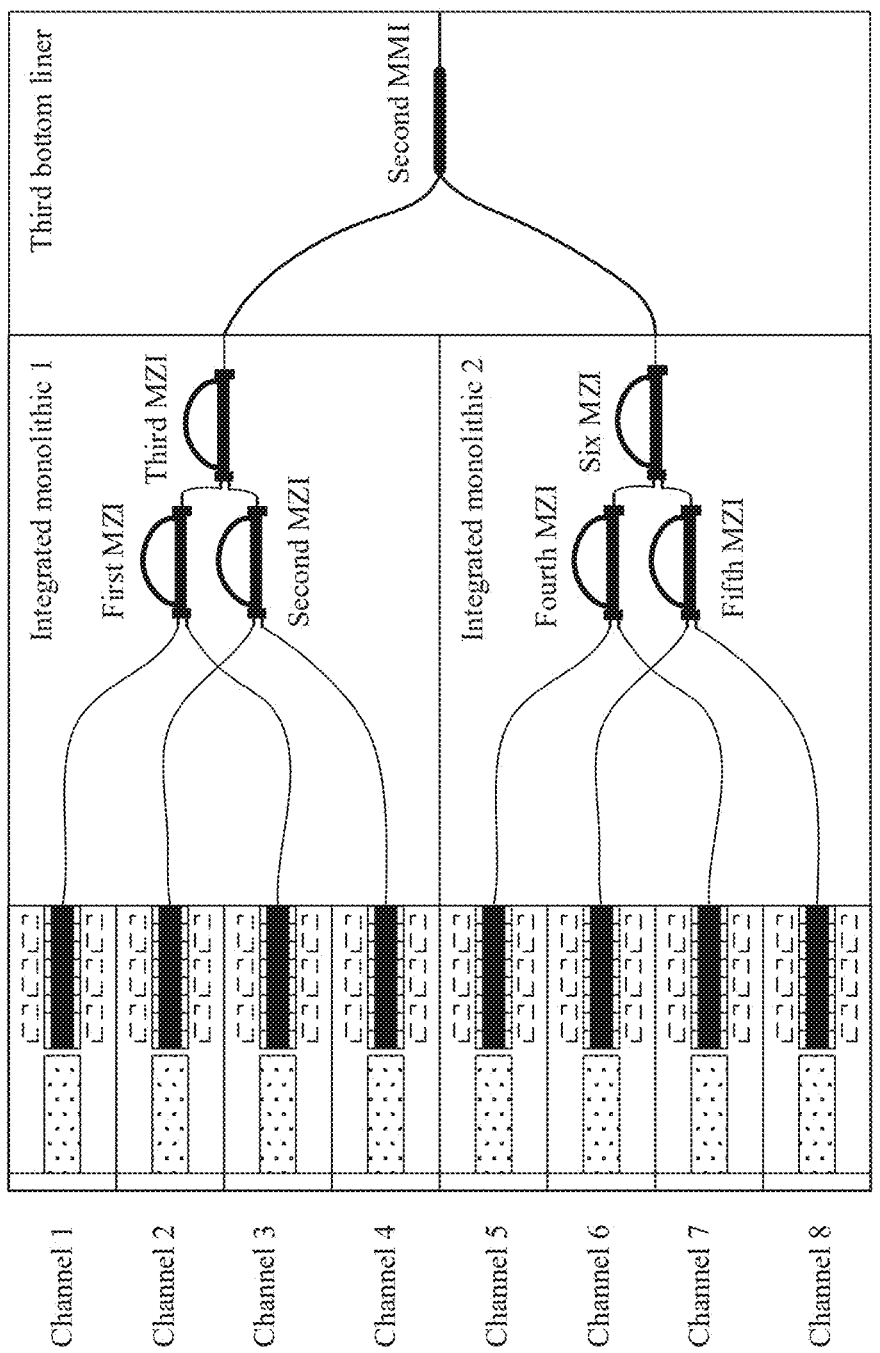
FIG. 19 is a schematic structural diagram 5 of a monolithically integrated array light source chip according to an embodiment of this application.

For example, as shown in FIG. 19, when N=2, the monolithically integrated array light source chip is a TOSA with eight channels which are respectively a channel 1, a channel 2, . . . , a channel 7, and a channel 8, and can multiplex and output eight light waves with different wavelengths. The monolithically integrated array light source chip includes two integrated monolithics. An integrated monolithic 1 performs multiplexing processing on light waves of first four channels (to be specific, the channel 1, the channel 2, the channel 3, and the channel 4), and a third MZI in an optical multiplexer in an integrated monolithic 2 outputs the light waves. The integrated monolithic 2 performs multiplexing processing on light waves of last four channels (to be specific, the channel 5, the channel 6, the channel 7, and the channel 8), and then a sixth MZI in an optical multiplexer in the integrated monolithic 2 outputs the light waves. Finally, the second MMI performs multiplexing processing on the light waves transmitted by the third MZI and the light waves transmitted by the sixth MZI, to multiplex and output the eight light waves with different wavelengths.

For a connection structure in each integrated monolithic, the connection structure may be a plurality of light waveguide paths, and is configured to guide transmission of a light wave on each channel. The connection structure may include two intersecting optical waveguide structures. For example, in the monolithically integrated array light source chip shown in FIG. 18, light waveguide paths of the channel 2 and the channel 3 intersect. Therefore, there are intersecting optical waveguide structures between the channel 2 and the channel 3. There may be mutual crosstalk between two light waves on the channel 2 and the channel 3.

Figure 20:
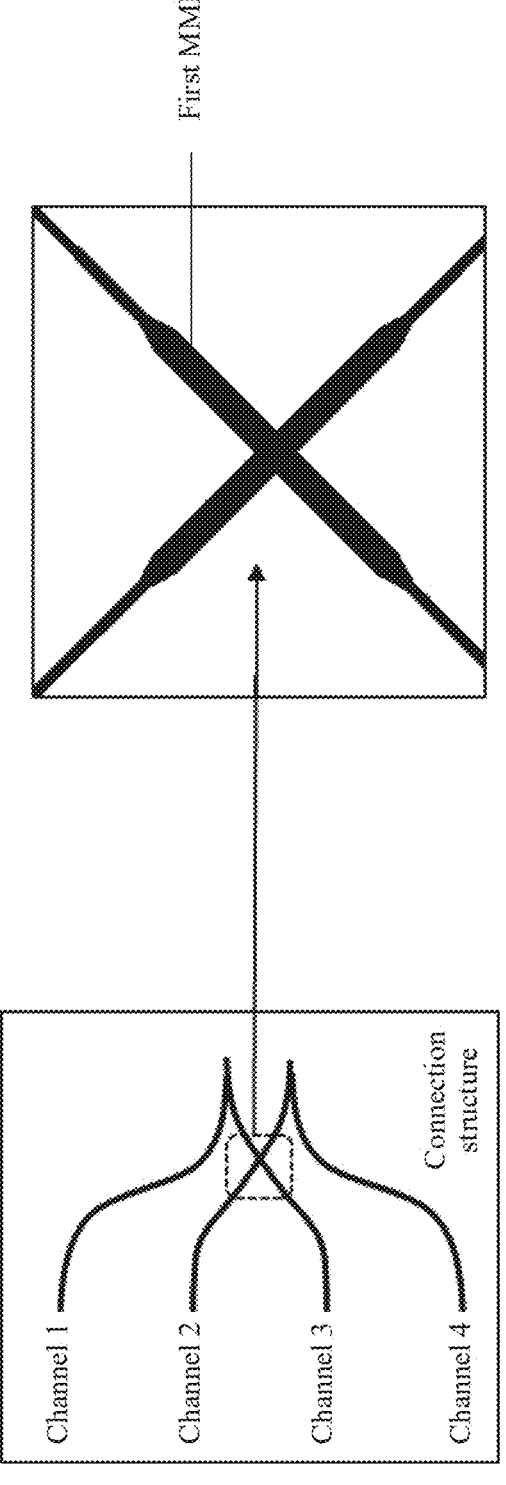
FIG. 20 is a schematic diagram of two intersecting optical waveguide structures according to an embodiment of this application.
Figure 21A:
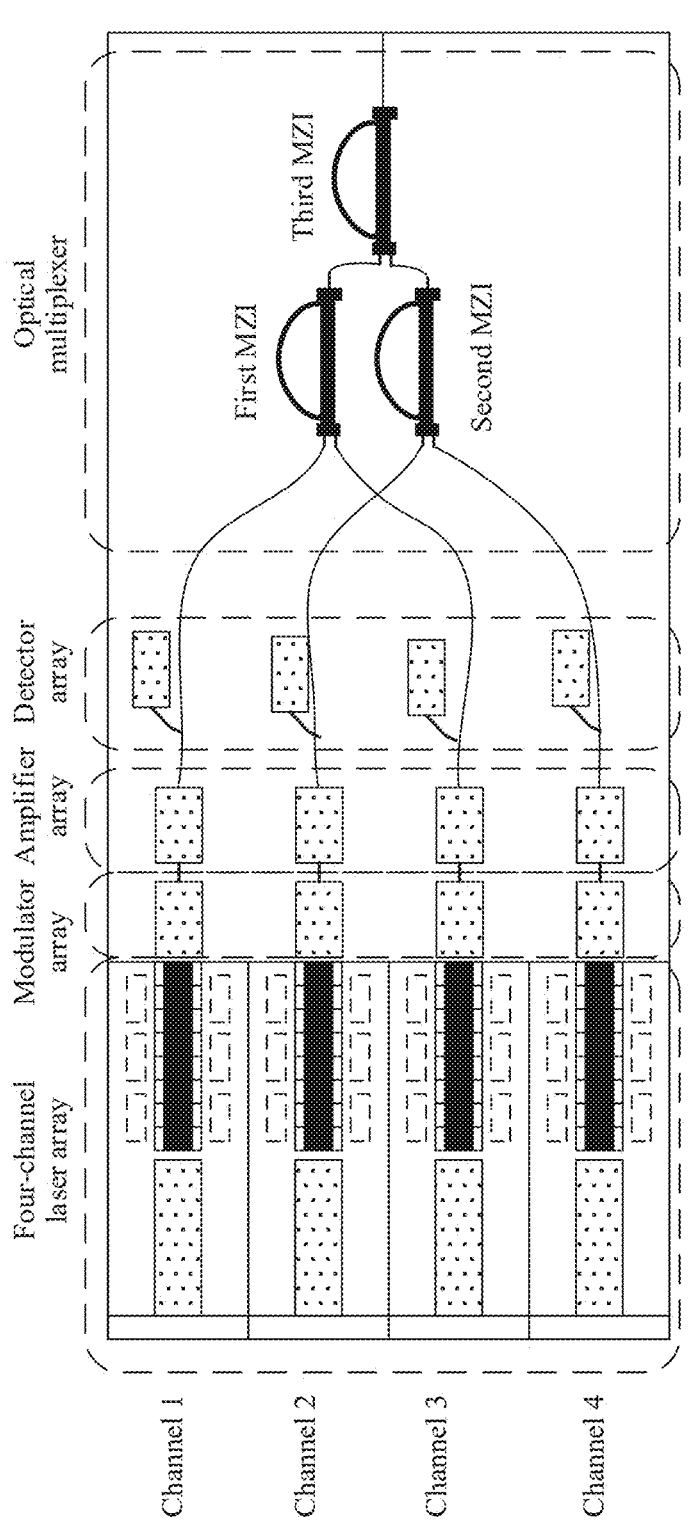
FIG. 21(a), FIG. 21(b), FIG. 21(c), and FIG. 21(d) are a schematic structural diagram 6 of a monolithically integrated array light source chip according to an embodiment of this application.
Figure 21B:
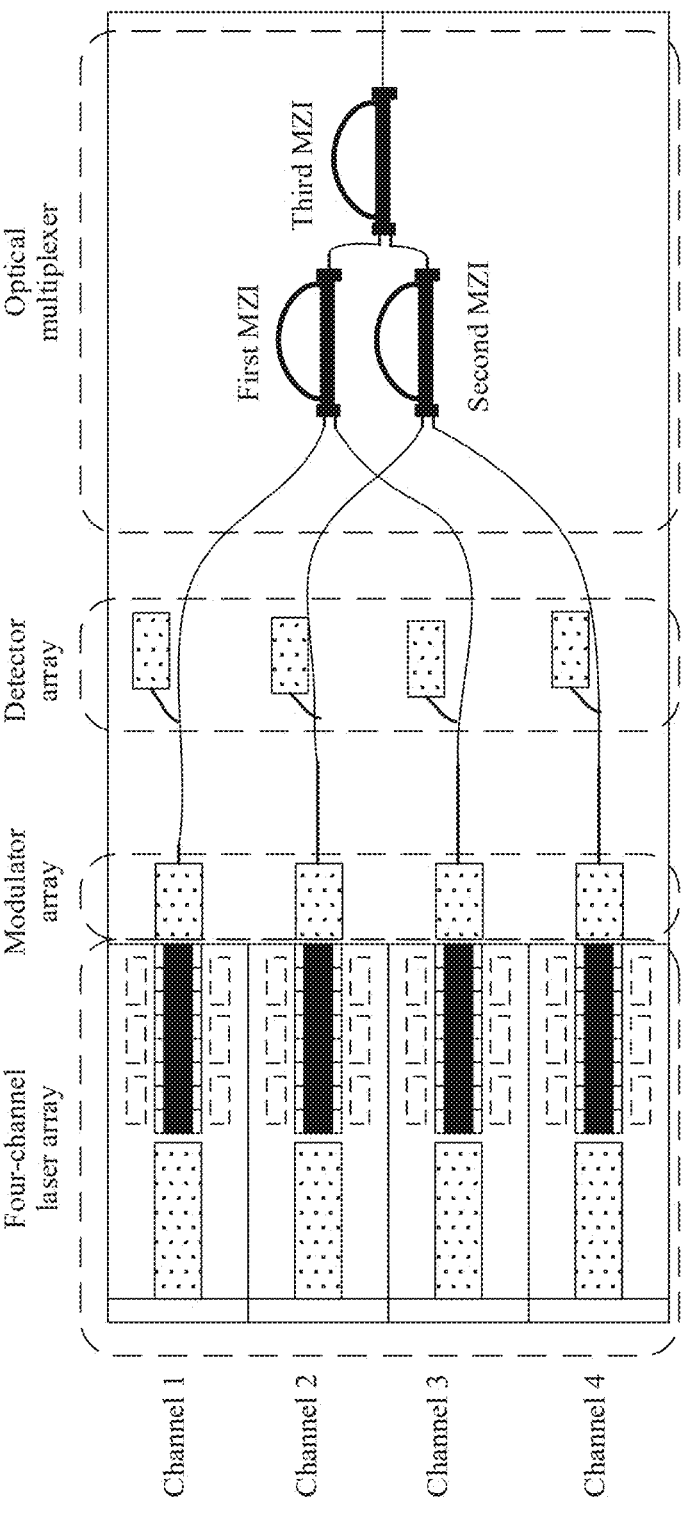
Figure 21C:
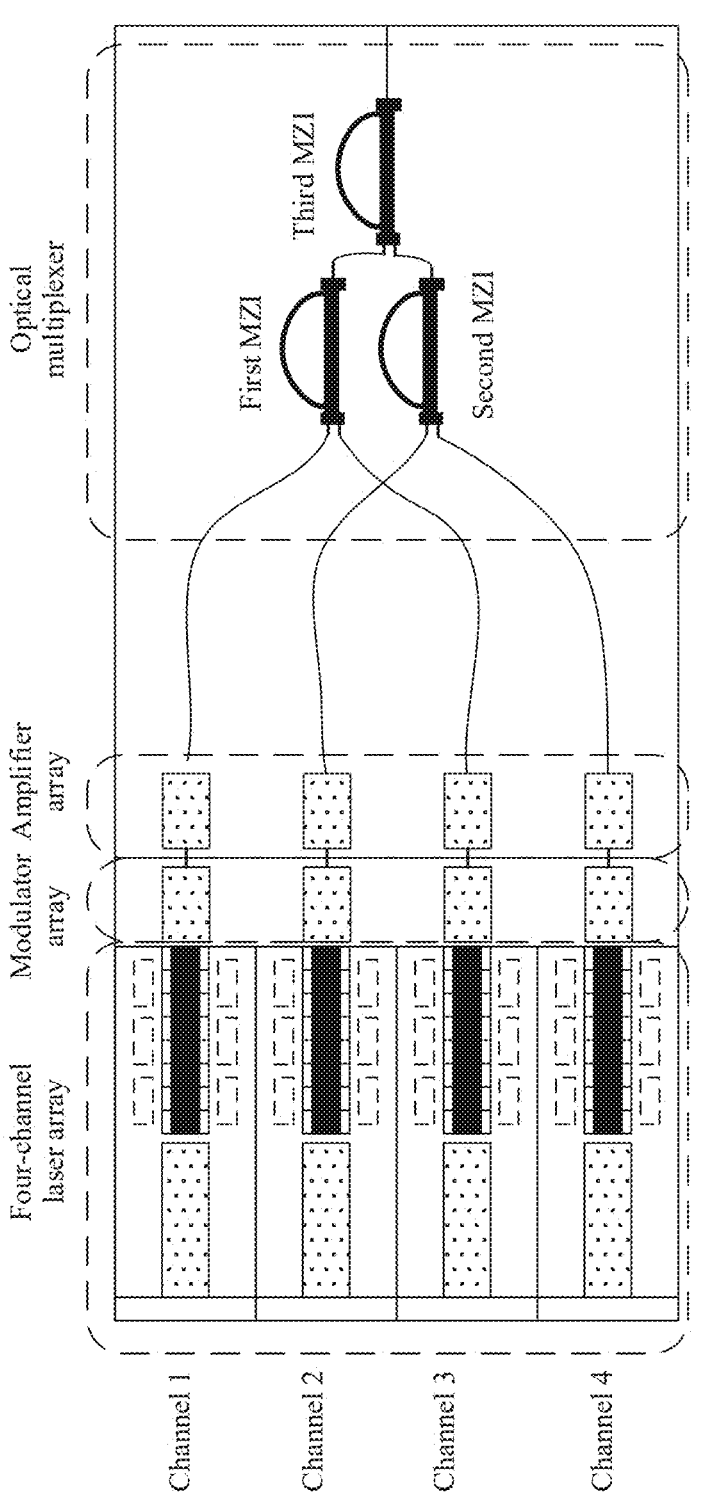
Figure 21D:
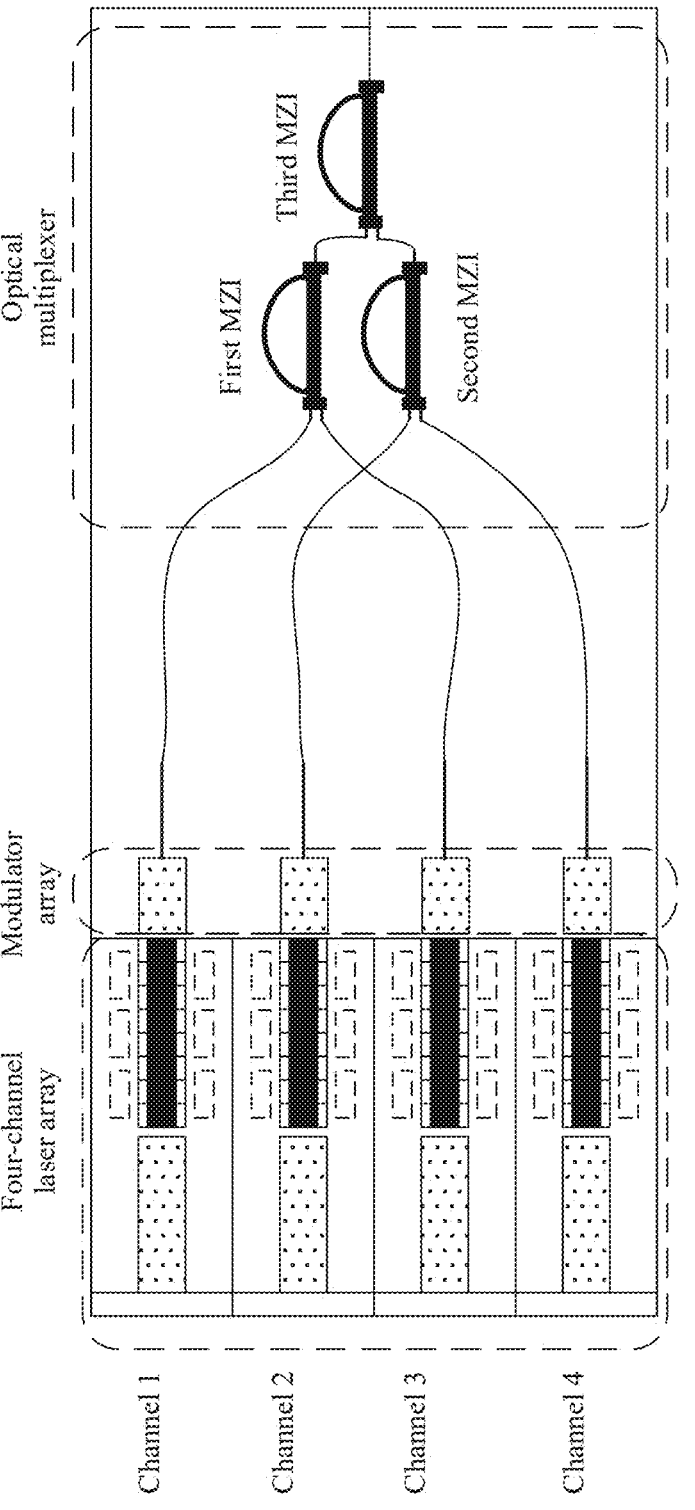

In an example, when two intersecting optical waveguide structures exist in the connection structure, the two intersecting optical waveguide structures may include two first MMIs perpendicular to each other. As shown in FIG. 20, the first MMI is of a 1×1 (namely, one output and one input) structure. Orthogonality of a link light wave is implemented by using the two first MMIs perpendicular to each other, thereby preventing crosstalk.

It should be noted that, on one hand, according to the monolithically integrated array light source chip provided in this application, a plurality of two-segment DBR lasers and the optical multiplexer are integrated, so that one monolithically integrated array light source chip can implement multiplexing and outputting of a plurality of light waves with different wavelengths. The monolithically integrated array light source chip can replace at least 14 discrete components in a conventional multi-wavelength TOSA, greatly reducing a quantity of optical components that need to be encapsulated and coupled, and thereby reducing complexity and costs of optical encapsulation.

On the other hand, compared with that an overall yield of DFB lasers in the conventional multi-wavelength TOSA is less than 50%, the two-segment DBR lasers used in the monolithically integrated array light source chip provided in the embodiments of the present invention can implement 100% wavelength alignment and single-mode selection, and therefore can ensure an overall yield of the monolithically integrated array light source chip, further reducing costs. In addition, compared with an over-6 dB multiplexing loss of an MMI optical multiplexer in the conventional multi-wavelength TOSA, a multiplexing loss of the cascaded MZI optical multiplexer used in the monolithically integrated array light source chip provided in the embodiments of the present invention is less than 2.5 dB, so that an overall loss of the monolithically integrated array light source chip can be reduced.

Optionally, the monolithically integrated array light source chip provided in this application has extendability. For example, one or more functional device arrays such as a modulator array, an amplifier array, and a detector array may be integrated between a four-channel laser array and an optical multiplexer of each integrated monolithic, to extend a function of the monolithically integrated array light source chip.

For example, as shown in FIG. 21(*a*), a modulator array, an amplifier array, and a detector array are integrated between a four-channel laser array and an optical multiplexer. Each functional device array includes four functional devices corresponding to four two-segment DBR lasers. A modulator in the modulator array may be an EAM, or may be an MZ modulator, and is configured to implement high-speed signal loading. An amplifier in the amplifier array is configured to perform power amplification on a light wave on a corresponding channel. A detector in the detector array is configured to perform power detection on a light wave on a corresponding channel.

As shown in FIG. 21(*b*), a modulator array and a detector array are integrated between a four-channel laser array and an optical multiplexer.

As shown in FIG. 21(*c*), a modulator array and an amplifier array are integrated between a four-channel laser array and an optical multiplexer.

As shown in FIG. 21(*d*), a modulator array is integrated between a four-channel laser array and an optical multiplexer.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A two-segment distributed bragg reflector (DBR) laser, comprising:
   a grating region for outputting a light wave of a selected wavelength, a gain region, and a broadband reflector for reflecting light waves of wavelengths, wherein:

the grating region and the broadband reflector are respectively disposed at two ends of the gain region;

the grating region comprises a first bottom liner, a first support structure, a first ridge waveguide structure, and a first heater;

the first ridge waveguide structure comprises a first ridge portion, a first trench portion, a second trench portion, a first protection structure, and a second protection structure, and wherein a height of the first ridge portion over the first bottom liner is the same as a height of the first protection structure over the first bottom liner, the height of the first ridge portion over the first bottom liner is a distance from a surface of the first ridge portion that is closest to the first bottom liner to a surface of the first ridge portion that is farthest from the first bottom liner, and the height of the first protection structure is a distance from a surface of the first protection structure that is closest to the first bottom liner to a surface of the first protection structure that is farthest from the first bottom liner;

the first ridge waveguide structure is fastened by the first support structure and suspended in midair above the first bottom liner, and the first bottom liner, the first support structure and the first ridge waveguide structure jointly form a cavity;

in a plan view of the first ridge waveguide structure, the first support structure does not extend beyond a periphery of the first protection structure and the second protection structure;

a distance between two opposite side walls of the first support structure is greater than a distance between two opposite side walls of the first protection structure and the second protection structure;

a reflectivity of the broadband reflector is greater than 80 percent, and a coverage range with respect to a center wavelength of the broadband reflector is greater than 50 nanometers (nm);

the first heater is located on a surface that is of the first ridge portion and that faces away from the cavity; and each of the first protection structure, the second protection structure, and the first ridge portion have a same number of layers, and each of the first protection structure, the second protection structure, and the first ridge portion have more than one layer.

2. The two-segment DBR laser according to claim 1, wherein:

the first support structure comprises a first support piece and a second support piece;

one end of the first support piece and one end of the second support piece are fastened on a side surface of the first bottom liner and that faces toward the first ridge waveguide structure, and the one end of the first support piece and the one end of the second support piece are located at two ends, away from each other, of the side surface; and the first ridge waveguide structure is fastened at the other end that is of the first support piece and that is away from the first bottom liner and at the other end that is of the second support piece and that is away from the first bottom liner.

3. The two-segment DBR laser according to claim 2, wherein a height of the first support piece is equal to a height of the second support piece.

4. The two-segment DBR laser according to claim 2, wherein:

the first protection structure is opposite to the second protection structure;

the first trench portion is located between the first ridge portion and the first protection structure, and the second trench portion is located between the first ridge portion and the second protection structure; and a distance between two opposite side walls of the first support piece and the second support piece is greater than the distance between the two opposite side walls of the first protection structure and the second protection structure.

5. The two-segment DBR laser according to claim 4, wherein at least one through hole extends through the first trench portion or the second trench portion, and the at least one through hole is in connection with the cavity.

6. The two-segment DBR laser according to claim 4, wherein at least one first through hole extends through the first trench portion and at least one second through hole extends through the second trench portion, and the at least one first through hole and the at least one second through hole are in connection with the cavity.

7. The two-segment DBR laser according to claim 1, wherein the first heater is a metal resistor thin film, and the metal resistor thin film adheres to the surface that is of the first ridge waveguide structure and that faces away from the cavity.

8. The two-segment DBR laser according to claim 1, wherein the first heater is platinum or tantalum nitride.

9. A monolithically integrated array light source chip, comprising N integrated monolithics, wherein each of the N integrated monolithics comprises a second bottom liner and a four-channel laser array integrated on the second bottom liner, and N is an integer greater than or equal to 1, wherein:

the four-channel laser array comprises four two-segment DBR lasers, each of which is configured to generate a light wave of a wavelength, and wherein each two-segment DBR laser comprises:

a grating region for selecting the light wave of the wavelength, a gain region, and a broadband reflector for reflecting light waves, wherein:

the grating region and the broadband reflector are respectively disposed at two ends of the gain region;

the grating region comprises a first bottom liner, a first support structure, a first ridge waveguide structure, and a first heater;

the first ridge waveguide structure comprises a first ridge portion, a first trench portion, a second trench portion, a first protection structure, and a second protection structure, and wherein a height of the first ridge portion over the first bottom liner is the same as a height of the first protection structure over the first bottom liner, the height of the first ridge portion over the first bottom liner is a distance from a surface of the first ridge portion that is closest to the first bottom liner to a surface of the first ridge portion that is farthest from the first bottom liner, and the height of the first protection structure is a distance from a surface of the first protection structure that is closest to the first bottom liner to a surface of the first protection structure that is farthest from the first bottom liner;

the first ridge waveguide structure is fastened by the first support structure and suspended in midair above the first bottom liner, and the first bottom liner, the first support structure and the first ridge waveguide structure jointly form a cavity;

in a plan view of the first ridge waveguide structure, the first support structure does not extend beyond a periphery of the first protection structure and the second protection structure;

a distance between two opposite side walls of the first support structure is greater than a distance between two opposite side walls of the first protection structure and the second protection structure;

a reflectivity of the broadband reflector is greater than 80 percent, and a coverage range with respect to a center wavelength of the broadband reflector is greater than 50 nanometers (nm); and the first heater is located on a surface that is of the first ridge waveguide structure and that faces away from the cavity; and each of the first protection structure, the second protection structure, and the first ridge portion have a same number of layers, and each of the first protection structure, the second protection structure, and the first ridge portion have more than one layer.

10. The monolithically integrated array light source chip according to claim 9, wherein a functional device array is further integrated at a light output end located at the four-channel laser array on the second bottom liner, and the functional device array comprises at least one of a modulator array, an amplifier array, or a detector array.

11. The monolithically integrated array light source chip according to claim 9, wherein N is an integer greater than 1, the monolithically integrated array light source chip further comprises a third bottom liner, and the N integrated monolithics are integrated in parallel on the third bottom liner.

12. The monolithically integrated array light source chip according to claim 9, wherein in each two-segment DBR laser:

the first support structure comprises a first support piece and a second support piece;

one end of the first support piece and one end of the second support piece are fastened on a side surface of the first bottom liner and that faces toward the first ridge waveguide structure, and the one end of the first support piece and the one end of the second support piece are located at two ends, away from each other, of the side surface; and the first ridge waveguide structure is fastened at the other end that is of the first support piece and that is away from the first bottom liner and at the other end that is of the second support piece and that is away from the first bottom liner.

13. The monolithically integrated array light source chip according to claim 12, wherein in each two-segment DBR laser a height of the first support piece is equal to a height of the second support piece.

14. The monolithically integrated array light source chip according to claim 9, wherein in each two-segment DBR laser:

the first protection structure is opposite to the second protection structure;

the first support structure comprises a first support piece and a second support piece;

the first trench portion is located between the first ridge portion and the first protection structure, and the second trench portion is located between the first ridge portion and the second protection structure; and a distance between two opposite side walls of the first support piece and the second support piece is greater than the distance between the two opposite side walls of the first protection structure and the second protection structure.

15. The monolithically integrated array light source chip according to claim 14, wherein in each two-segment DBR laser at least one through hole extends through the first trench portion or the second trench portion, and the at least one through hole is in connection with the cavity.

16. The monolithically integrated array light source chip according to claim 9, wherein in each two-segment DBR laser the first heater is a metal resistor thin film, and the metal resistor thin film adheres to the surface that is of the first ridge waveguide structure and that faces away from the cavity.

17. A two-segment distributed bragg reflector (DBR) laser, comprising:

a grating region for outputting a light wave of a selected wavelength;

a gain region; and a broadband reflector for reflecting light waves of wavelengths, the broadband reflector comprising a film deposited on a surface, wherein a reflectivity of the broadband reflector is greater than 80 percent, and a coverage range of with respect to center wavelength of the broadband reflector is greater than 50 nanometers (nm); and wherein:

the grating region and the broadband reflector are respectively disposed at two ends of the gain region;

the grating region comprises a first bottom liner, a first support structure, a first ridge waveguide structure, and a first heater;

the first ridge waveguide structure comprises a first ridge portion, a first trench portion, a second trench portion, a first protection structure, and a second protection structure, and wherein a height of the first ridge portion over the first bottom liner is the same as a height of the first protection structure over the first bottom liner, the height of the first ridge portion over the first bottom liner is a distance from a surface of the first ridge portion that is closest to the first bottom liner to a surface of the first ridge portion that is farthest from the first bottom liner, the height of the first protection structure is a distance from a surface of the first protection structure that is closest to the first bottom liner to a surface of the first protection structure that is farthest from the first bottom liner;

the first ridge waveguide structure is fastened by the first support structure and suspended in midair above the first bottom liner, and the first bottom liner, the first support structure and the first ridge waveguide structure jointly form a cavity;

in a plan view of the first ridge waveguide structure, the first support structure does not extend beyond a periphery of the first protection structure and the second protection structure;

a distance between two opposite side walls of the first support structure is greater than a distance between two opposite side walls of the first protection structure and the second protection structure;

the first heater is located on a surface that is of the first ridge portion and that faces away from the cavity; and the surface of the broadband reflector on which the film is deposited comprises a first surface and a second surface, and the second surface is recessed compared to the first surface.

18. The two-segment DBR laser according to claim 17, wherein the broadband reflector is a multimode interference (MMI) reflector.

19. The two-segment DBR laser according to claim 17, wherein each of the first protection structure, the second protection structure, and the first ridge portion have a same number of layers, and each of the first protection structure, the second protection structure, and the first ridge portion have more than one layer.

20. The two-segment DBR laser according to claim 17, wherein the first heater is platinum or tantalum nitride.

\* \* \* \* \*